United States Patent
Balakrishnan et al.

(10) Patent No.: US 9,722,048 B1
(45) Date of Patent: Aug. 1, 2017

(54) VERTICAL TRANSISTORS WITH REDUCED BOTTOM ELECTRODE SERIES RESISTANCE

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/082,142

(22) Filed: Mar. 28, 2016

(51) Int. Cl.
| | | |
|---|---|---|
| *H01L 21/3065* | (2006.01) | |
| *H01L 29/66* | (2006.01) | |
| *H01L 29/417* | (2006.01) | |
| *H01L 29/78* | (2006.01) | |
| *H01L 21/768* | (2006.01) | |

(52) U.S. Cl.
CPC .... *H01L 29/66666* (2013.01); *H01L 21/3065* (2013.01); *H01L 21/76895* (2013.01); *H01L 29/41766* (2013.01); *H01L 29/7827* (2013.01)

(58) Field of Classification Search
CPC ............. H01L 21/3065; H01L 29/66666
See application file for complete search history.

(56) References Cited

U.S. PATENT DOCUMENTS

| | | | | |
|---|---|---|---|---|
| 8,389,416 | B2* | 3/2013 | Luong | H01L 21/6831 438/710 |
| 9,525,064 | B1* | 12/2016 | Balakrishnan | H01L 29/7827 |
| 2008/0029809 | A1* | 2/2008 | Morioka | H01L 29/66242 257/329 |
| 2013/0193511 | A1* | 8/2013 | Fang | H01L 29/7827 257/334 |
| 2016/0240533 | A1* | 8/2016 | Oxland | H01L 27/092 |

OTHER PUBLICATIONS

Karthik Balakrishnan, et al.; "Channel-Last Replacement Metal-Gate Vertical Field Effect Transistor"; U.S. Appl. No. 15/149,282, filed May 9, 2016.
List of IBM Patents or Patent Applications Treated as Related—Date Filed: May 11, 2016; 1 page.
(Continued)

*Primary Examiner* — Jarrett Stark
*Assistant Examiner* — Charles N Ausar-El
(74) *Attorney, Agent, or Firm* — Cantor Colburn LLP; Louis Percello

(57) ABSTRACT

A semiconductor device includes a source including a first doped semiconductor layer arranged on a substrate, a layer of metal arranged on the first doped semiconductor layer, and a second doped semiconductor layer arranged on the layer of metal; a channel extending from the second doped semiconductor layer to a drain including an epitaxial growth; a gate disposed on sidewalls of the channel between the second doped semiconductor layer and the drain; an interlayer dielectric (ILD) disposed on the second doped semiconductor layer and the gate; and a source contact extending from a surface of the ILD to abut the layer of metal of the source.

14 Claims, 24 Drawing Sheets

(56) References Cited

OTHER PUBLICATIONS

Karthik Balakrishnan, et al.; "Channel-Last Replacement Metal-Gate Vertical Field Effect Transistor"; U.S. Appl. No. 14/970,977, filed Dec. 16, 2015.
Karthik Balakrishnan, et al.; "Vertical Transistor Structure With Reduced Parasitic Gate Capacitance"; U.S. Appl. No. 15/082,131, filed Mar. 28, 2016.
Karthik Balakrishnan, et al.; "Top Metal Contact for Vertical Transistor Structures"; U.S. Appl. No. 15/082,150, filed Mar. 28, 2016.
List of IBM Patents or Patent Applications Treated as Related—Date Filed: Mar. 28, 2016; 1 page.
Klaus, J. W., et al.; "Atomic Layer Deposition of Tungsten Using Sequential Surface Chemistry With a Sacrificial Stripping Reaction"; Thin Solid Films; vol. 360; p. 145-153; 2000.

\* cited by examiner

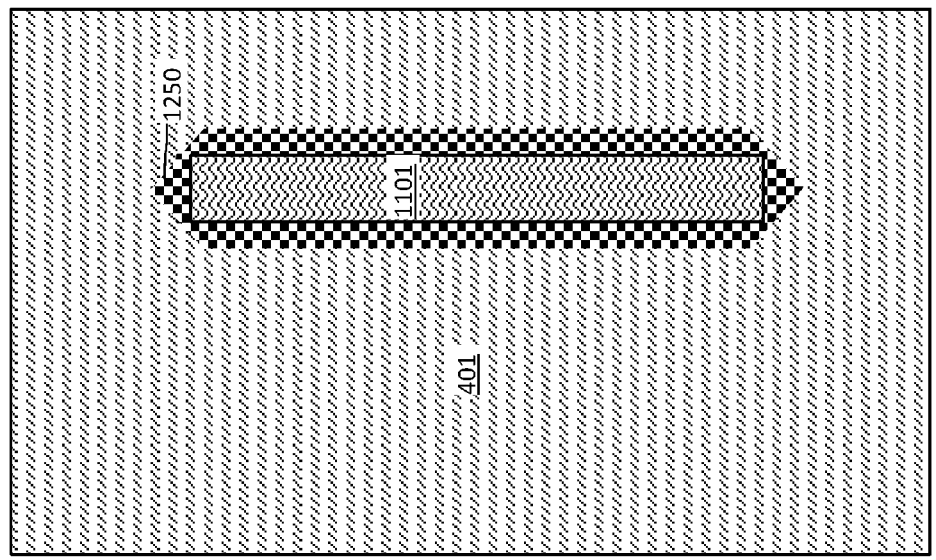
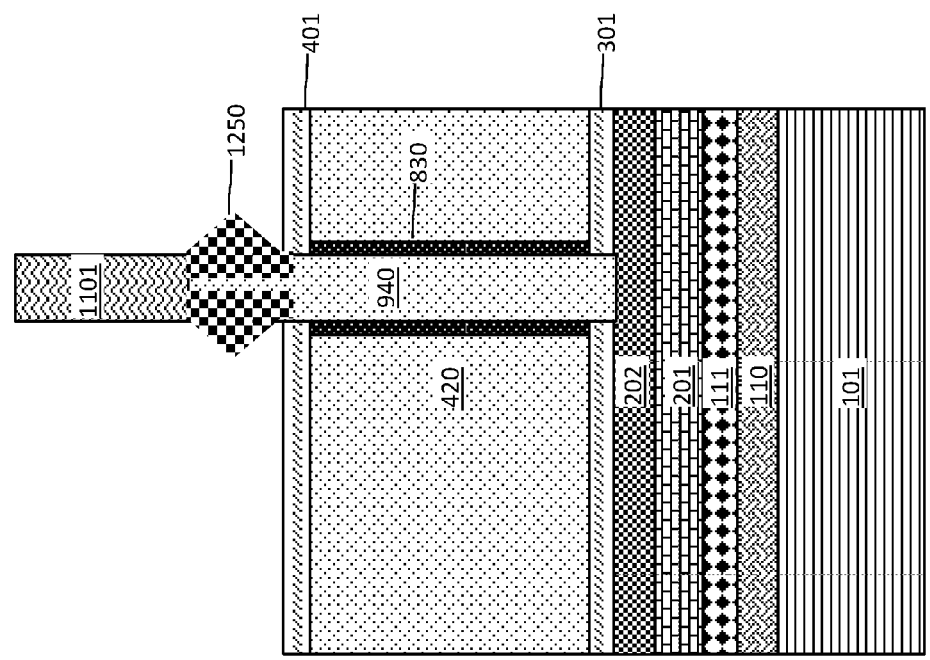
FIG. 12A
FIG. 12B

VERTICAL TRANSISTORS WITH REDUCED BOTTOM ELECTRODE SERIES RESISTANCE

BACKGROUND

The present invention relates to complementary metal oxide semiconductor (CMOS) technology, and more specifically, to vertical transistor semiconductor devices.

CMOS is used for constructing integrated circuits. CMOS technology is used in microprocessors, microcontrollers, static random access memory (RAM), and other digital logic circuits. CMOS designs may use complementary and symmetrical pairs of p-type and n-type metal oxide semiconductor field effect transistors (MOSFETs) for logic functions.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

As MOSFETs are scaled to smaller dimensions, various designs and techniques are employed to improve device performance. Vertical transistors, in which source/drain regions are arranged on opposing ends of a vertical channel region, are attractive candidates for scaling to smaller dimensions. Vertical transistors may provide higher density scaling and allow for relaxed gate lengths to better control device electrostatics, without sacrificing the gate contact pitch size.

SUMMARY

According to an embodiment, a method of making a semiconductor includes disposing a first doped semiconductor layer on a substrate; disposing an un-doped semiconductor layer on the first doped semiconductor layer; disposing a second doped semiconductor layer on the un-doped semiconductor layer; disposing an inter-layer dielectric (ILD) on the second doped semiconductor layer; removing a portion of the ILD, the second doped semiconductor layer, and the un-doped semiconductor layer to form a trench that extends from a surface of the ILD to the un-doped semiconductor layer; removing the un-doped semiconductor layer by a selective etch process such that the first doped semiconductor layer and the second doped semiconductor layer remain substantially intact and to form a horizontal opening between the first doped semiconductor layer and the second doped semiconductor layer; and depositing a metal to fill the trench in the ILD and the horizontal opening to form a metal layer between the first doped semiconductor layer and the second doped semiconductor layer, the first doped semiconductor layer, the metal layer, and the second doped semiconductor layer forming a source.

According to another embodiment, a method of making a semiconductor device includes forming four epitaxial layers on a substrate to form a source region, the four epitaxial layers being: a counter-doped layer; a first doped layer arranged on the counter-doped layer; an un-doped layer arranged on the first doped layer; and a second doped layer arranged on the un-doped layer, the first doped layer and the second doped layer including a p-type dopant, and the counter-doped layer including an n-type dopant; disposing an inter-layer dielectric (ILD) on the second doped layer; removing a portion of the ILD, the second doped layer, and the un-doped layer to form a source contact trench that extends from a surface of the ILD to the un-doped layer; removing the un-doped layer to form a horizontal opening between the first doped layer and the second doped layer; and depositing a metal in the source contact trench and the horizontal opening to form a source contact that abuts a horizontal layer of metal that extends between the first doped layer and the second doped layer.

Yet, according to another embodiment, a semiconductor device includes a source including a first doped semiconductor layer arranged on a substrate, a layer of metal arranged on the first doped semiconductor layer, and a second doped semiconductor layer arranged on the layer of metal; a channel extending from the second doped semiconductor layer to a drain including an epitaxial growth; a gate disposed on sidewalls of the channel between the second doped semiconductor layer and the drain; an interlayer dielectric (ILD) disposed on the second doped semiconductor layer and the gate; and a source contact extending from a surface of the ILD to abut the layer of metal of the source.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIGS. 1-26B illustrate exemplary methods of making semiconductor devices according to embodiments, in which:

FIG. 1 is a cross-sectional side view of a first doped semiconductor layer and a counter-doped layer arranged on a substrate;

FIG. 2 is a cross-sectional side view after forming an un-doped semiconductor layer and a second doped semiconductor layer on the first doped semiconductor layer;

FIG. 3 is a cross-sectional side view after forming a first spacer on the second doped semiconductor layer;

FIG. 4 is a cross-sectional side view after disposing a sacrificial gate material and a second spacer on the first spacer;

FIGS. 12A and 12B are a cross-sectional side view and top view, respectively, after removing the oxide and forming a source/drain region on the channel by an epitaxial growth process;

FIGS. 26A and 26B are a cross-sectional side view and a top view, respectively, after forming drain contacts.

DETAILED DESCRIPTION

Although vertical transistors may be used for smaller device scaling, one challenge that may arise when a single layer of a doped semiconductor material is used as the bottom electrode (source region or drain region). For example, when a single layer of a doped semiconductor material is used as the source, the series resistance of the source region may be too high because of the large distance between the source of the transistor and the contact.

Accordingly, various embodiments described herein provide semiconductor devices and methods of making semiconductor devices that reduce resistance of the bottom contact electrode (source/drain). In embodiments, the bottom/lower contact electrode semiconductor material (e.g., the source) is partially replaced with a contact metal layer. A portion of the doped semiconductor material remains in the final device for contact and extension formation. Methods of making the device includes initially forming a source that includes three layers, with an un-doped layer arranged between doped source layers. The un-doped layer is subsequently replaced with a layer of metal which reduces the resistance at the source contact electrode.

It will be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

Figure 1:
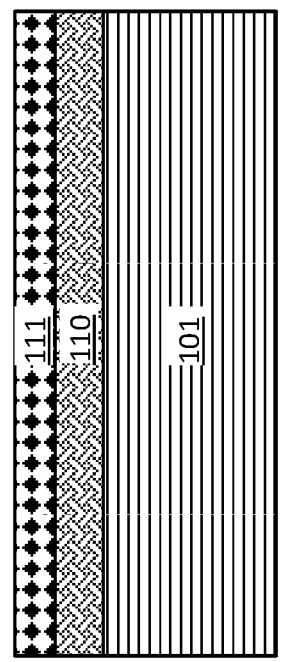

Turning now to the Figures, FIGS. 1-26B illustrate exemplary methods of making semiconductor devices according to embodiments. FIG. 1 is a cross-sectional side view of a first doped semiconductor layer 111 and a counter-doped layer 110 arranged on a substrate 101. The substrate 101 may be a bulk substrate and may include one or more semiconductor materials. Non-limiting examples of suitable substrate 101 materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CaSe (cadmium selenide), CaS (cadmium sulfide), CaTe (cadmium telluride), ZnO (zinc oxide), ZnSe (zinc selenide), ZnS (zinc sulfide), or ZnTe (zinc telluride)), or any combination thereof. The substrate 101 may be a silicon-on-insulator substrate (SOI) or a silicon-germanium-on-insulator (SGOI) substrate with a buried oxide (BOX) layer.

The counter-doped layer 110 is arranged on the substrate 101. The first doped semiconductor layer 111 is arranged on the counter-doped layer 110. The first doped semiconductor layer 111 may form a portion of the source. In other embodiments, the doped semiconductor layer 111 may form a portion of the drain. The first doped semiconductor layer 111 and the counter-doped layer 110 are formed on the substrate 101 by incorporating dopants into the substrate 101 or by forming an epitaxial growth layer on the substrate 101 to form epitaxial layers. The first doped semiconductor layer 111 and the counter-doped layer 110 include semiconductor materials. The first doped semiconductor layer 111 and the counter-doped layer 110 may include, for example, silicon, silicon germanium, or any of the above semiconductor materials described above for the substrate 101.

When the first doped semiconductor layer 111 and the counter-doped layer 110 are epitaxial layers, the epitaxial layers may be grown using a suitable growth process, for example, chemical vapor deposition (CVD), liquid phase (LP) or reduced pressure chemical vapor deposition (RP-CVD), vapor-phase epitaxy (VPE), molecular-beam epitaxy (MBE), liquid-phase epitaxy (LPE), metal organic chemical vapor deposition (MOCVD), or other suitable processes.

The first doped semiconductor layer 111 is doped with a dopant, which may be a p-type dopant (e.g., boron) or an n-type dopant (e.g., phosphorus or arsenic). The counter-doped layer 110 includes a dopant that is different than, or opposite to, the first doped semiconductor layer 111. For example, when the first doped semiconductor layer 111 includes a p-type dopant, the counter-doped layer 110 includes an n-type dopant. Similarly, when the first doped semiconductor layer 111 includes an n-type dopant, the counter-doped layer 110 includes a p-type dopant. The counter-doped layer 110 may be used to isolate the subsequently formed structure from the substrate 101 in later processing steps. The first doped semiconductor layer 111 may be heavily doped and include a dopant concentration in a range from about 1019 to about 1022 atoms/cm$^3$. The thickness of the first doped semiconductor layer 111 may be in a range from about 20 to about 30 nm, or from about 10 to about 200 nm.

Figure 2:
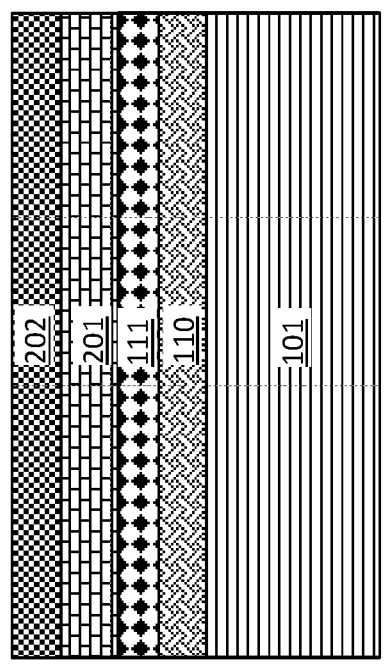

FIG. 2 is a cross-sectional side view after disposing an un-doped semiconductor layer 201 and a second doped semiconductor layer 202 on the first doped semiconductor layer 111. The un-doped semiconductor layer 201 and the second doped semiconductor layer 202 may be formed using an epitaxial growth process as described above for the first doped semiconductor layer 111 and the counter-doped layer 110. The un-doped semiconductor layer 201, the second doped semiconductor layer 202, the counter-doped layer 110, and the first doped semiconductor layer 111 may be epitaxial layers and may be formed in the same epitaxial reactor without an air break in between layer formation.

The un-doped semiconductor layer 201 includes the same semiconductor materials as the first doped semiconductor layer 201, but without a dopant. The un-doped semiconductor layer 201 may have a thickness in a range from about 20 to about 50 nm, or from about 10 to about 200 nm.

The second doped semiconductor layer 202 also includes the same semiconductor materials and dopants as the first doped semiconductor layer 201. The second doped semiconductor layer 202 may have a thickness in a range from about 10 to about 20 nm, or from about 5 to about 30 nm.

In some embodiments, the first doped semiconductor layer 111, the un-doped layer 201, the second doped semiconductor layer 202, and the counter-doped layer 110 include the same semiconductor materials. In one embodiment, the first doped semiconductor layer 111, the un-doped layer 201, the second doped semiconductor layer 202, and the counter-doped layer 110 include silicon germanium.

Instead of forming a source/drain from a single doped semiconductor layer, the source/drain region is initially formed by splitting the doped semiconductor layer into three layers (first doped semiconductor layer 111, un-doped semiconductor layer 201, and second doped semiconductor layer 202). In some embodiments, these three layers form a source region. In other embodiments, the three layers form a drain region. Using two doped layers opposing an un-doped layer allows for subsequent selective etch removal of the un-doped layer (see FIGS. 23A and 23B below) and replacement with a lower resistance metal (see FIGS. 24A and 24B).

Figure 3:
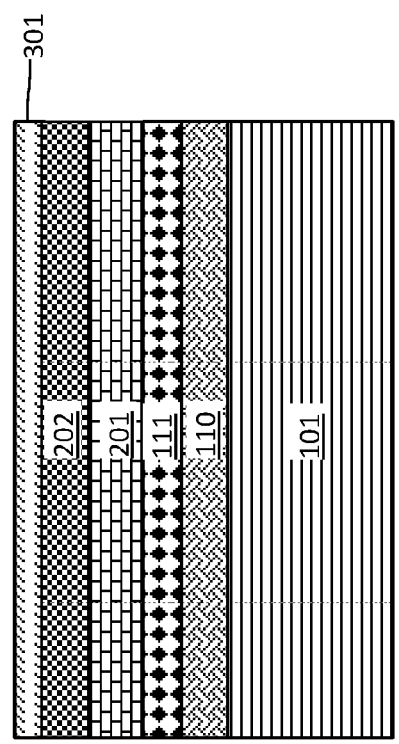

FIG. 3 is a cross-sectional side view after forming a first spacer 301 on the second doped semiconductor layer 202. The first spacer 301 (bottom spacer) may include an insulating material, for example, silicon dioxide, silicon nitride, SiOCN, or SiBCN. Other non-limiting examples of materials for the first spacer 301 include dielectric oxides (e.g., silicon oxide), dielectric nitrides (e.g., silicon nitride), dielectric oxynitrides, or any combination thereof. The first spacer 301 material is deposited by a deposition process, for example, chemical vapor deposition (CVD) or physical vapor deposition (PVD). The first spacer may have a thickness of about 3 to about 15 nm, or of about 5 to about 10 nm.

Figure 4:
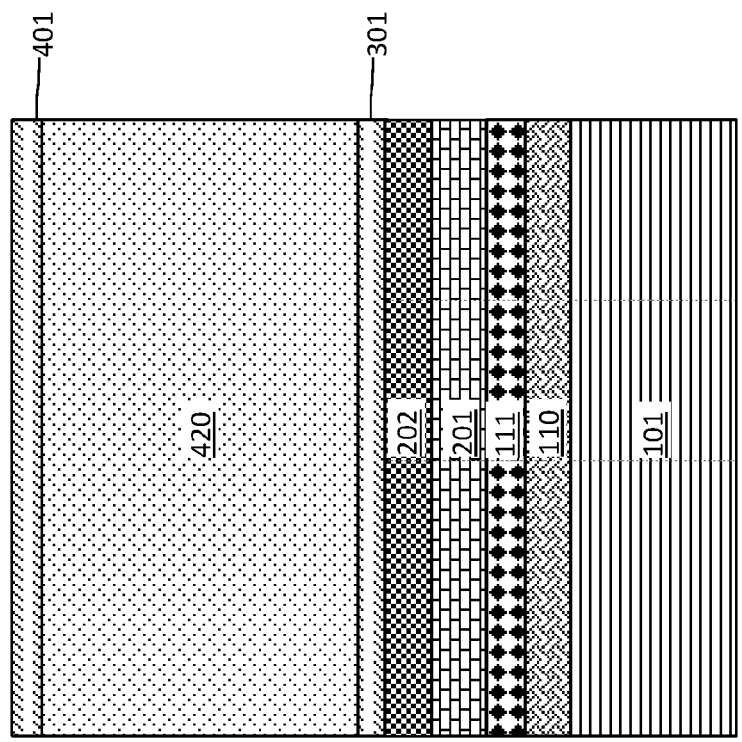

FIG. 4 is a cross-sectional side view after disposing a sacrificial gate material 420 and a second spacer 401 on the first spacer 301. The sacrificial gate material 420 (dummy gate material) may be, for example, amorphous silicon (aSi) or polycrystalline silicon (polysilicon). The sacrificial gate material 420 may be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof. The sacrificial gate material 420 forming the dummy gate may have a thickness of about 8 to about 100, or from about 10 to about 30 nm.

The second spacer 401 (top spacer) may include any of the insulating materials or dielectric materials described above for first spacer 301. The second spacer 401 also may have a thickness of about 3 to about 15 nm, or of about 5 to about 10 nm.

Figure 5A:
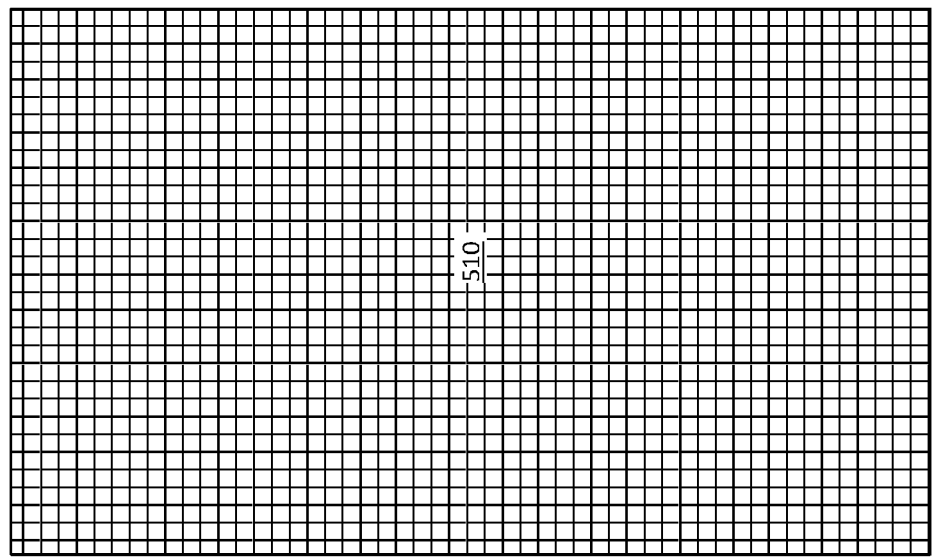
FIGS. 5A and 5B are a cross-sectional side view and a top view, respectively, after disposing an oxide on the second spacer.
Figure 5B:
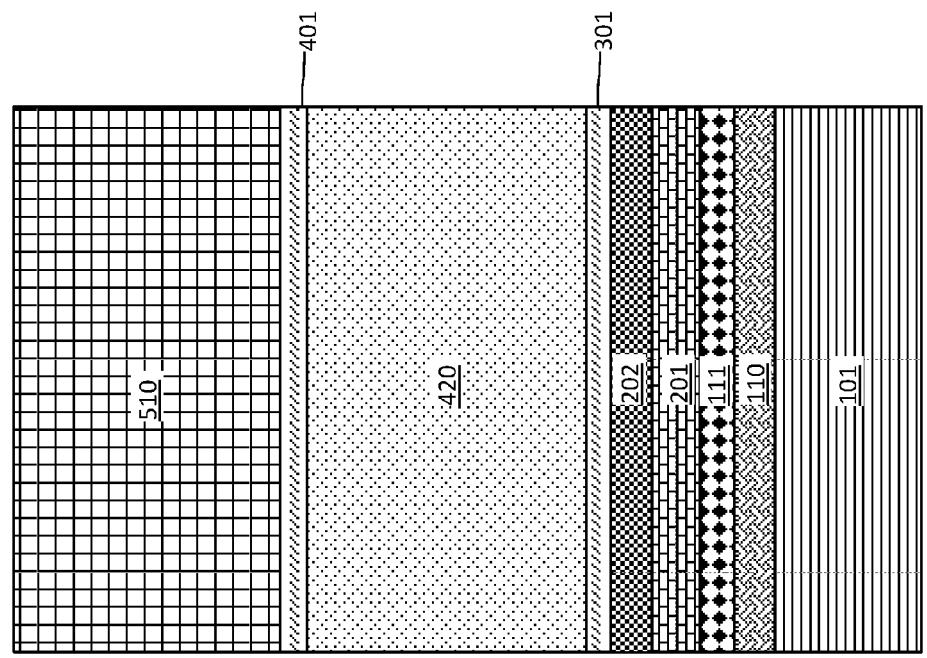

FIGS. 5A and 5B are a cross-sectional side view and a top view, respectively, after disposing an oxide 510 on the second spacer 401. The oxide 510 may include a dielectric oxide, for example, silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. The oxide 510 has a thickness in a range from about 30 to about 200 nm, or from about 50 to about 100 nm.

Figure 6B:
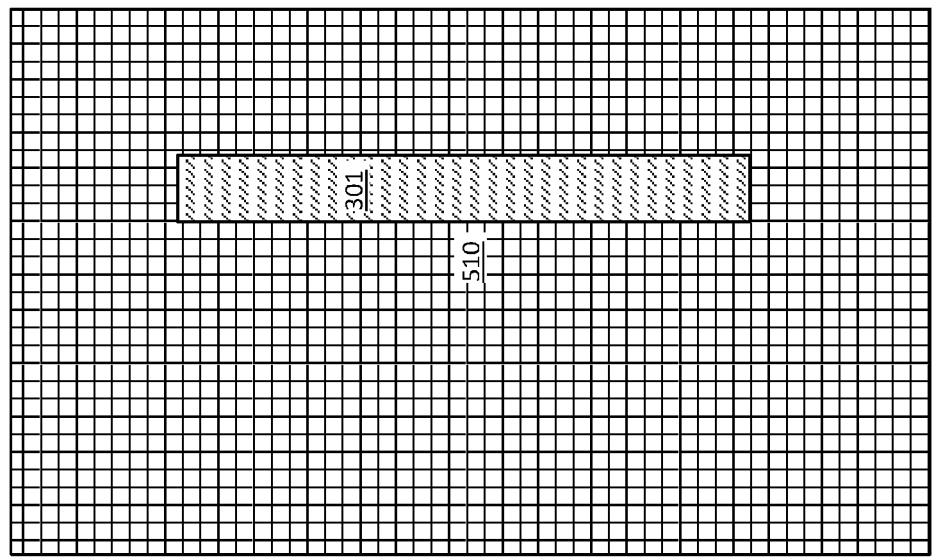
FIGS. 6A and 6B are a cross-sectional side view and a top view, respectively, after forming a trench through the oxide, second spacer, and sacrificial gate material.
Figure 6A:
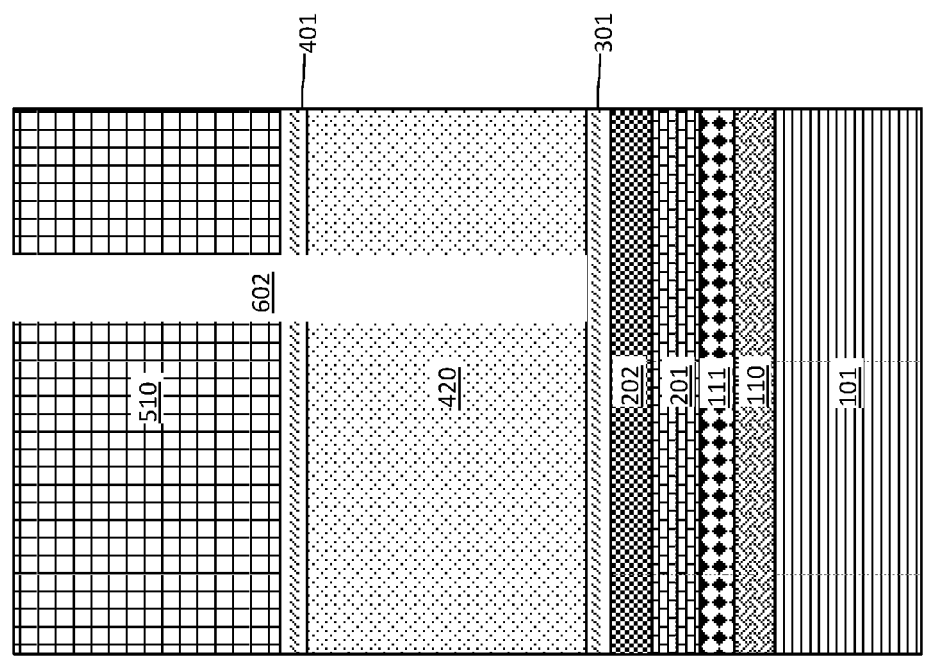

FIGS. 6A and 6B are a cross-sectional side view and a top view, respectively, after forming a trench 602 through the oxide 510, second spacer 401, and sacrificial gate material 420. A portion of the oxide 510, second spacer 401, and sacrificial gate material 420 may be removed by performing an etch process to expose the first spacer 301 (see FIG. 6B). The trench 602 extends from a surface of the oxide 510 through the first spacer 401 and the sacrificial gate material 420 to expose the first spacer 301. The trench 602 may be formed by performing an etch process that is selective to (will not substantially remove) the first spacer 301 material. The etch process may be, for example, a reactive ion etch (ME). Multiple etching processes are performed to form an opening/trench within the structure. For example, a first etching process is performed to remove a portion of the oxide 510 selective to the material of the second spacer 401. A second etching process is then performed to remove a portion of the second spacer 401, which underlies the portion of the trench 602 formed from the first etching process, selective to the material of the sacrificial gate material 420. A third etching process is then performed to remove a portion of the sacrificial gate material 420, which underlies the portion of the trench 602 formed from the second etching process, selective to the material of the first spacer 301. The width of the trench 602 may be about 3 to about 20 nm, or about 5 to about 10 nm. The depth of the trench 602 may be about 50 to about 300 nm, or from about 100 to about 200 nm.

Figure 7B:
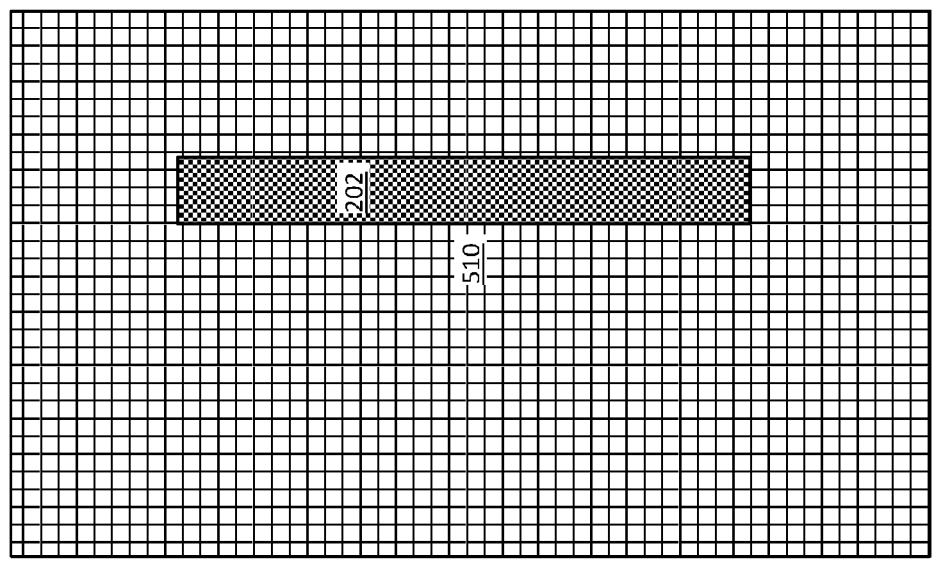
FIGS. 7A and 7B are a cross-sectional side view and a top view, respectively, after removing a portion of the first spacer to extend the trench to the second doped semiconductor layer.
Figure 7A:
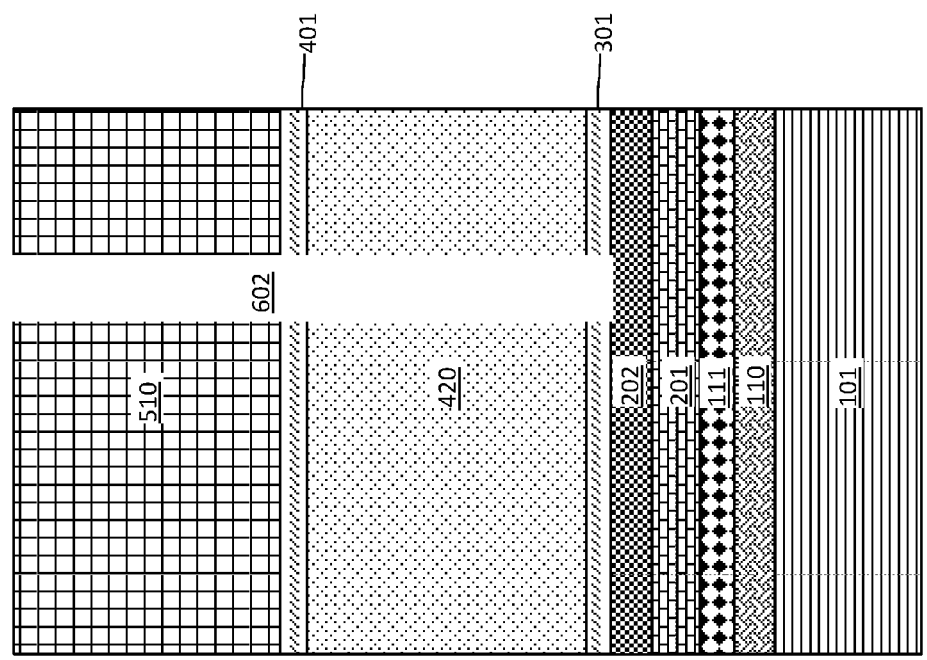

FIGS. 7A and 7B are a cross-sectional side view and a top view, respectively, after removing a portion of the first spacer 301 to extend the trench 602 to the second doped semiconductor layer 202. The first spacer 301 may etched using a process that is selective to (will not substantially remove) the second doped semiconductor layer 202. The first spacer 301 may be etched by, for example, a reactive ion etch (ME). The exposed portion of the first spacer 301 is removed by an etching process to expose a portion of the underlying second doped semiconductor layer 202. The trench 602 creates a self-aligned junction because a source/drain extension (channel) can be epitaxially grown from the second doped semiconductor layer 202 to a surface of the oxide 510.

Figure 8B:
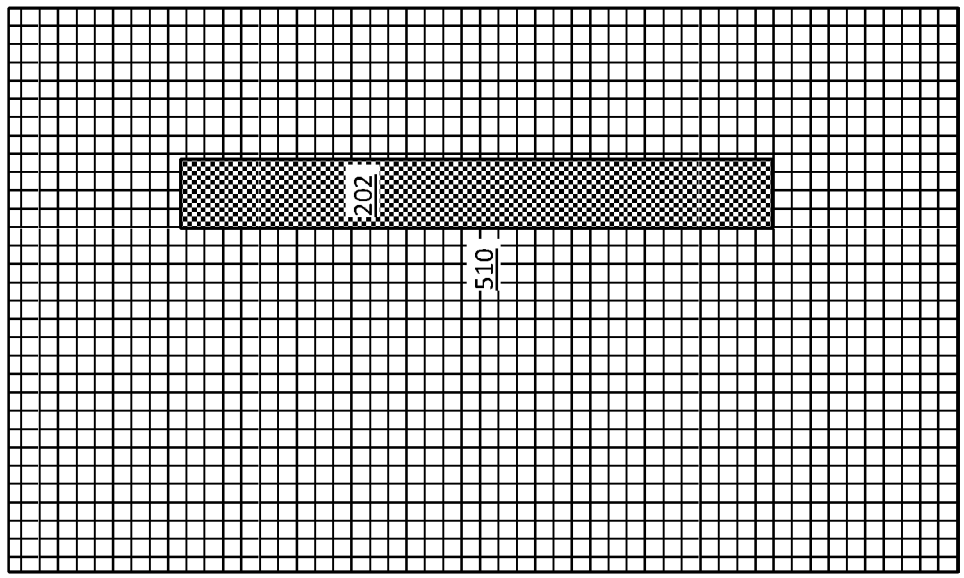
FIGS. 8A and 8B are a cross-sectional side view and a top view, respectively, after oxidizing sidewalls of the sacrificial gate material.
Figure 8A:
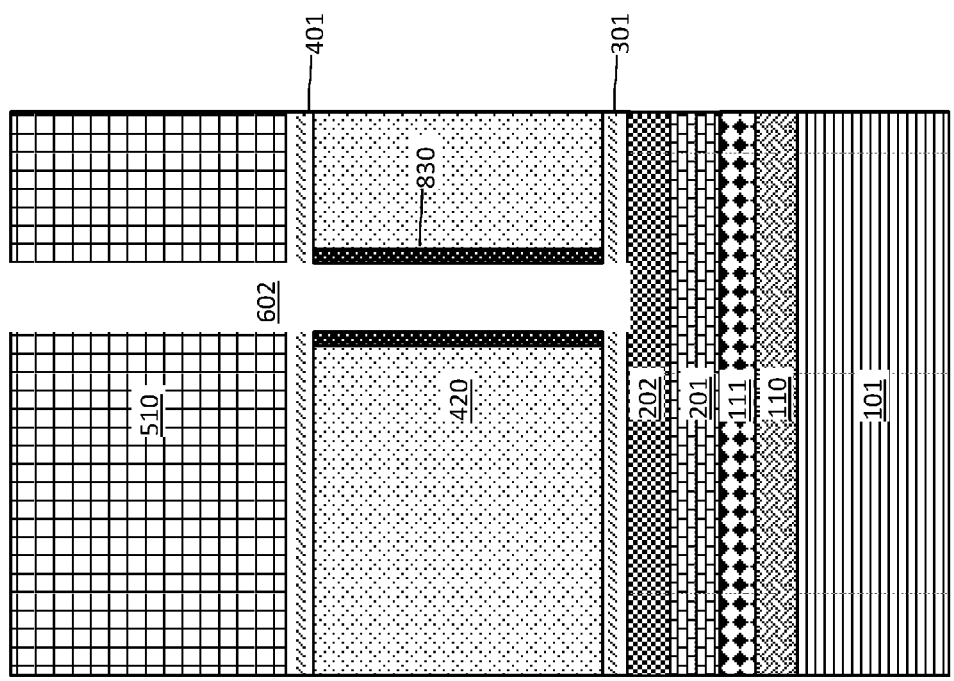

FIGS. 8A and 8B are a cross-sectional side view and a top view, respectively, after oxidizing sidewalls of the sacrificial gate material 830 to form a thin layer of oxide 830 along the sidewalls of the trench 602 in this region. The oxidation may be performed by a plasma oxidation process or other oxidation process that forms a thin layer of oxide 830. A portion of the first spacer 301 or the second doped semiconductor layer 202 also may be oxidized, but any oxide formed in these regions is removed before performing the epitaxial growth process to form the channel 940 (see FIGS. 9A and 9B).

Figure 9B:
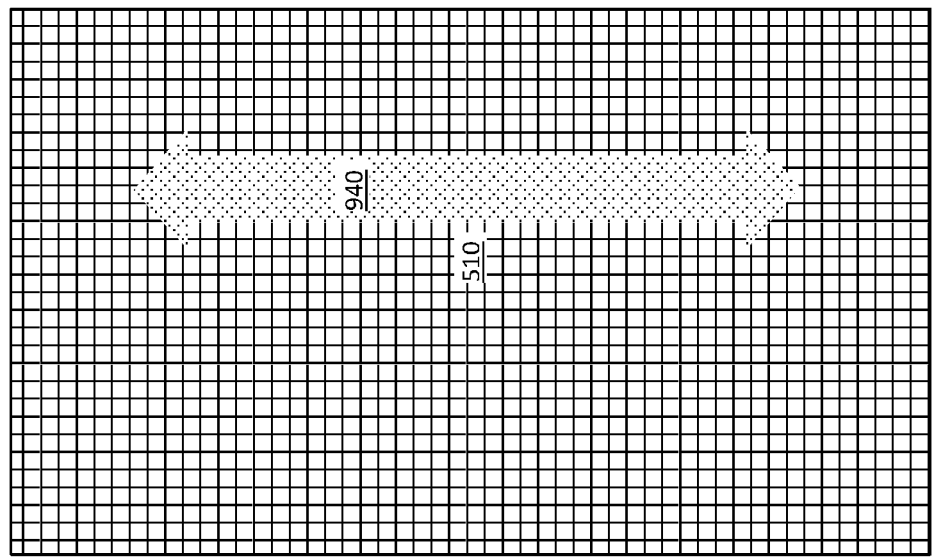
FIGS. 9A and 9B are a cross-sectional side view and a top view, respectively, after forming a channel in the trench by performing an epitaxial growth process.
Figure 9A:
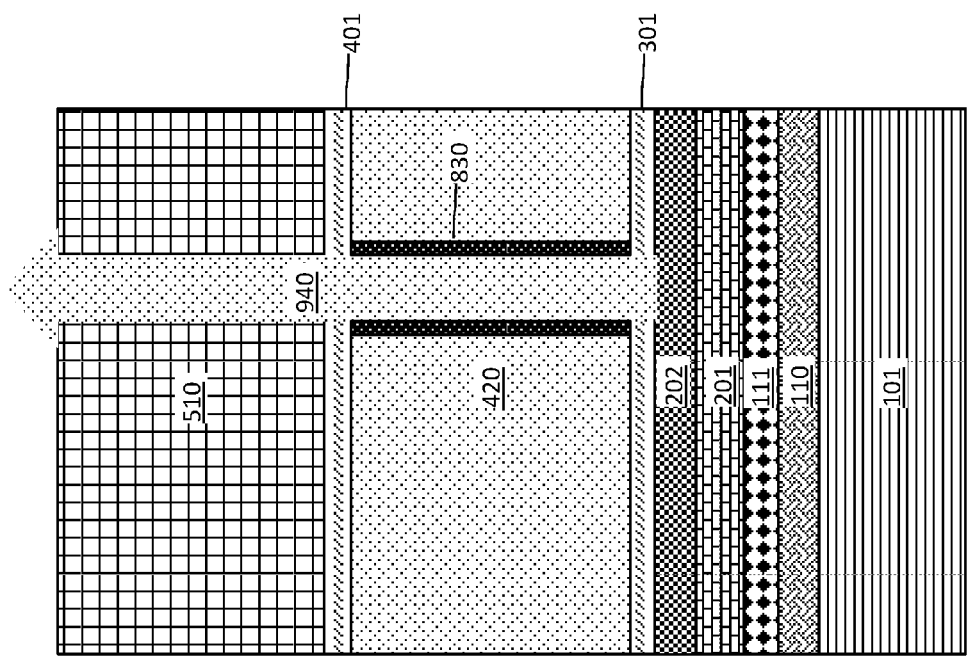

FIGS. 9A and 9B are a cross-sectional side view and a top view, respectively, after forming a channel 940 in the trench 602 by performing an epitaxial growth process. The epitaxial growth includes an epitaxial semiconductor material(s). The epitaxial growth and/or deposition processes are selective to forming on a semiconductor surface and do not deposit material on other surfaces, such as the oxide 510, first spacer 301 or second spacer 401. The epitaxial growth in the epitaxial channel 940 extends over the oxide 510. The epitaxial channel 940 may be grown using a suitable growth process, for example, chemical vapor deposition (CVD), liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes. The sources for the epitaxial channel material may be, for example, silicon, germanium, or a combination thereof.

Figure 10B:
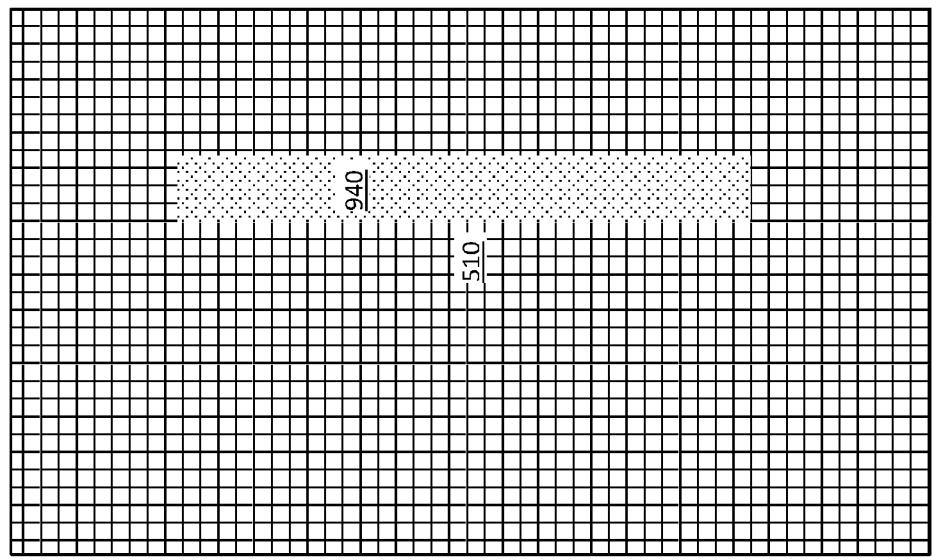
FIGS. 10A and 10B are a cross-sectional side view and a top view, respectively, after performing a planarization process to polish the surface of the epitaxial growth.
Figure 10A:
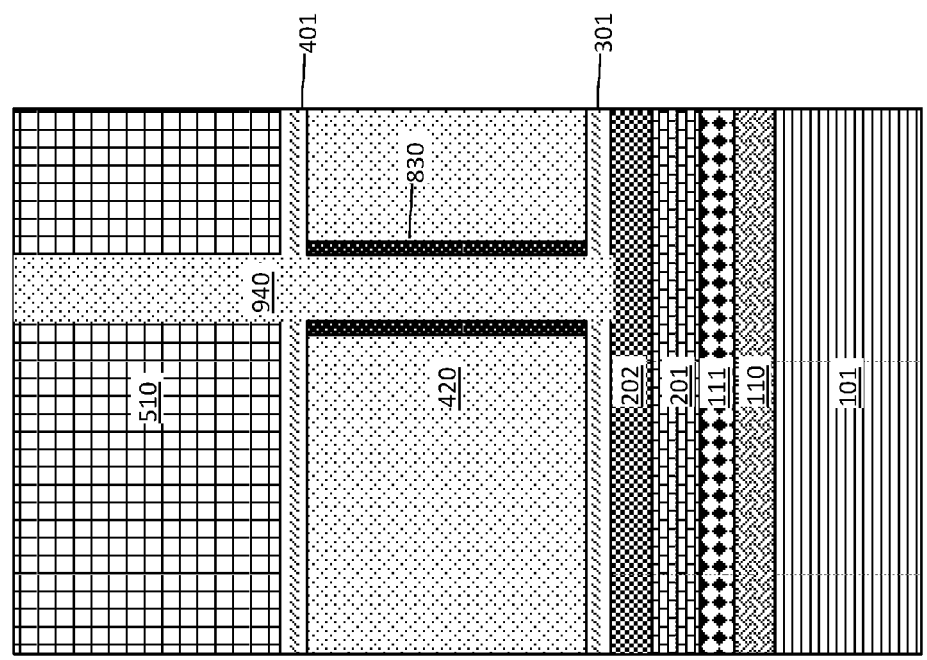

FIGS. 10A and 10B are a cross-sectional side view and a top view, respectively, after performing a planarization process to polish the surface of the epitaxial growth forming the channel 940. The planarization process may be a chemical mechanical planarization (CMP) process. Planarization removes excess epitaxial growth extending over the oxide 510.

Figure 11B:
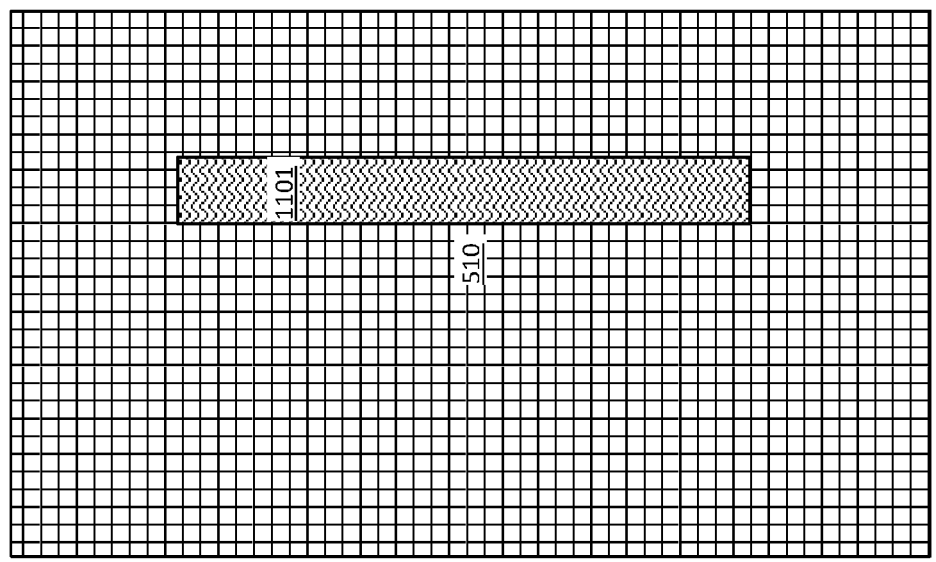
FIGS. 11A and 11B are a cross-sectional side view and a top view, respectively, after partially recessing the channel and depositing a dielectric material within the recess.
Figure 11A:
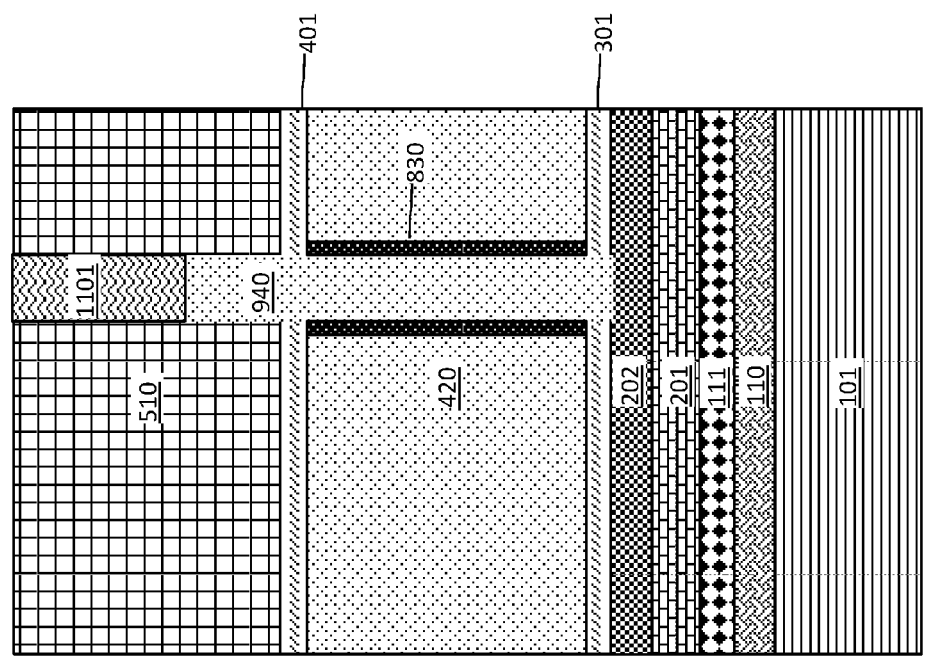

FIGS. 11A and 11B are a cross-sectional side view and a top view, respectively, after partially recessing the channel 940 and depositing a dielectric material 1101 within the recess. The epitaxial channel 940 is partially recessed to a level that is still within the oxide 510 and over the second spacer 401. The epitaxial channel 940 is recessed by etching, for example, by a RIE or a wet etch process.

The recess formed over the recessed epitaxial channel 940 is filled with the dielectric material 1101. The dielectric material 1101 may be a dielectric oxide (e.g., silicon oxide), a dielectric nitride (e.g., silicon nitride), a dielectric oxynitride, or any combination thereof. The dielectric material 1101 is deposited by a deposition process, for example, chemical vapor deposition (CVD) or physical vapor deposition (PVD). After deposition, the dielectric material 1101 is planarized, by for example, CMP. The dielectric material 1101 forms a dielectric cap over the channel 940.

FIGS. 12A and 12B are a cross-sectional side view and top view, respectively, after removing the oxide 510 and forming a source/drain region 1250 on the channel 940 by an epitaxial growth process. The source/drain region 1250 is arranged between the dielectric material 1101 and the channel 940. A portion of the epitaxial channel 940 over the second spacer 401 may be recessed along sidewalls before forming the epitaxial growth to form the source/drain region 1250. The epitaxial growth may be performed as described above. In some embodiments, the epitaxial growth forms a drain, and in other embodiments, the epitaxial growth forms a source.

Figure 13B:
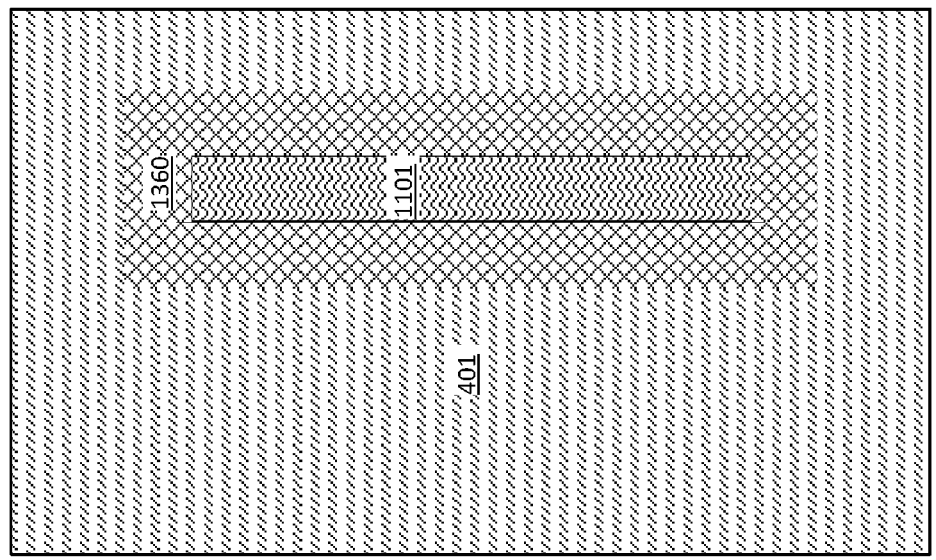
FIGS. 13A and 13B are a cross-sectional side view and a top view, respectively, after forming spacers along sidewalls of the source/drain region and the dielectric material.
Figure 13A:
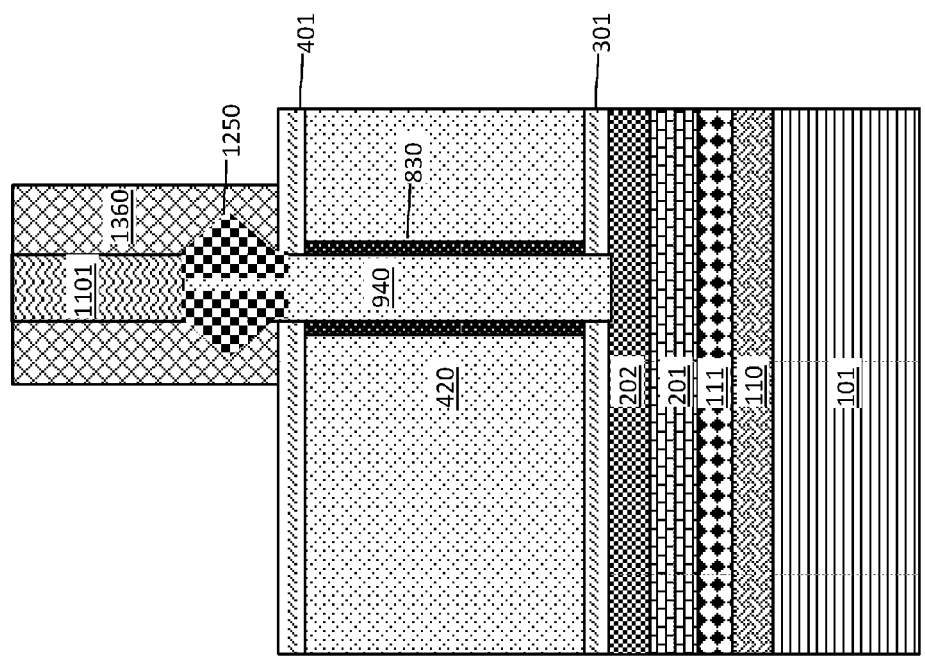

FIGS. 13A and 13B are a cross-sectional side view and a top view, respectively, after forming spacers 1360 along sidewalls of the source/drain region 1250 and the dielectric material 1101. The spacers 1360 protect the epitaxial growth of the source/drain region 1250. The spacers 1360 are also arranged on sidewalls of the dielectric material 1101. The spacers 1360 include an insulating material, for example, dielectric oxides (e.g., silicon oxide), dielectric nitrides (e.g., silicon nitride), dielectric oxynitrides, or any combination thereof. The spacer 1360 material is deposited by a deposition process, for example, chemical vapor deposition (CVD) or physical vapor deposition (PVD). The spacer 1101 material may be etched by a dry etch process, for example, a RIE process, such that it covers the epitaxial growth of the source/drain region 1250 and is removed from a surface of the dielectric material 1101 and the second spacer 401. The spacer 1101 material has a thickness of about 5 to about 50 nm, or from about 15 to about 30 nm.

Figure 14B:
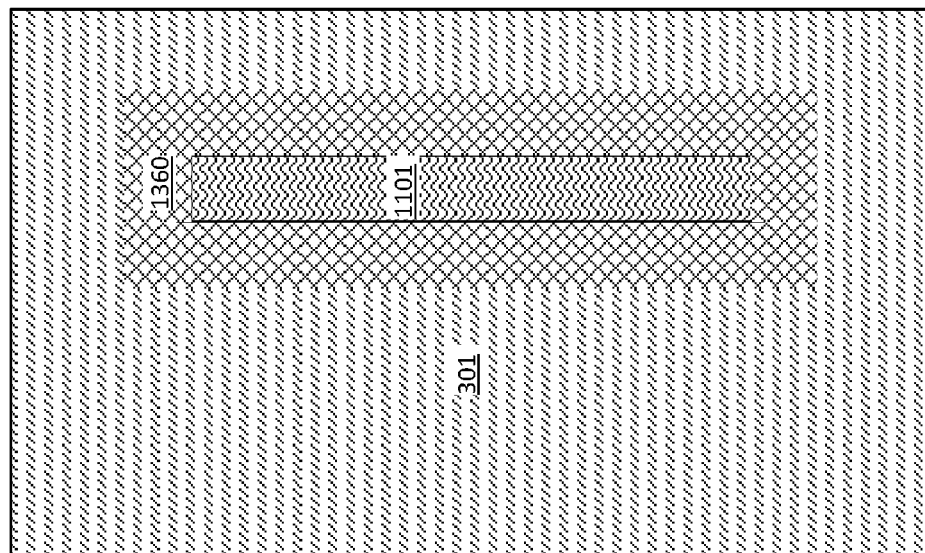
FIGS. 14A and 14B are a cross-sectional side view and a top view, respectively, after removing portions of the second spacer and sacrificial gate material.
Figure 14A:
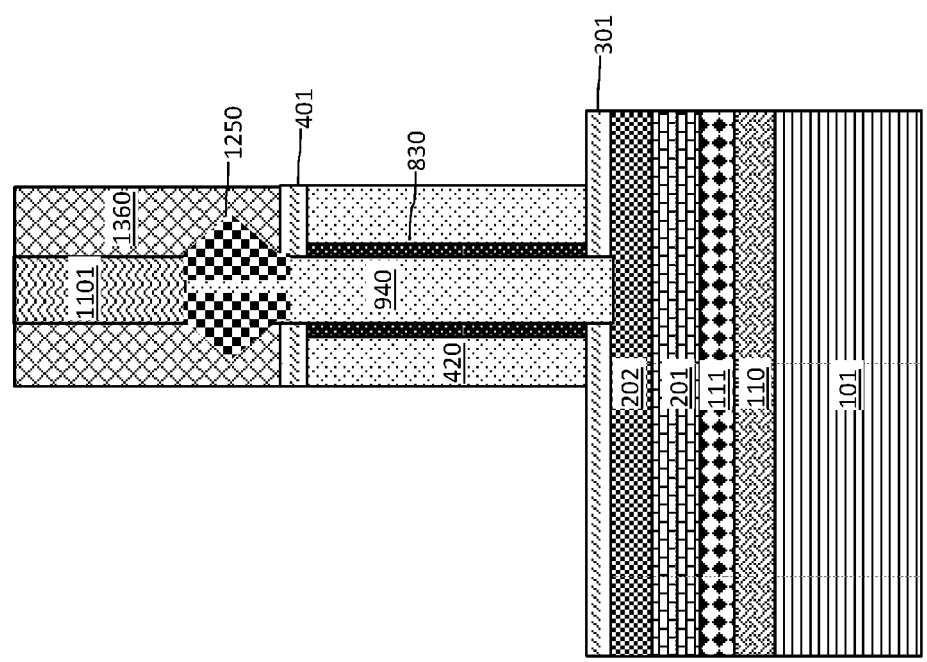

FIGS. 14A and 14B are a cross-sectional side view and a top view, respectively, after removing a portion of the second spacer 401 and sacrificial gate material 420. The second spacer 401 and the sacrificial gate material 420 are recessed to remove portions that extend horizontally beyond the spacer 1360 material. An etch process that is selective to (will not substantially remove) the first spacer 301 is performed. The etch process may be a dry etch process, such as a RIE process.

Figure 15B:
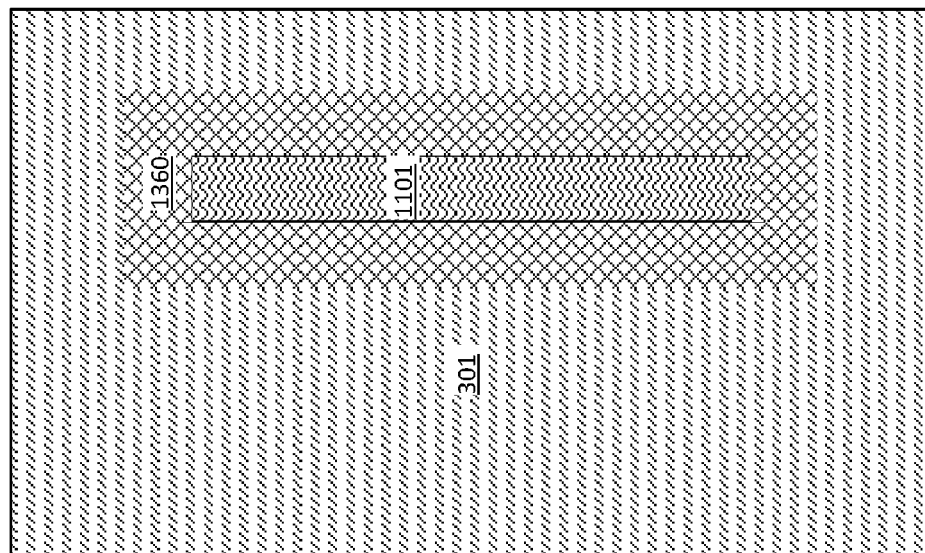
FIGS. 15A and 15B are a cross-sectional side view and a top view, respectively, after removing remaining portions of the sacrificial gate material.
Figure 15A:
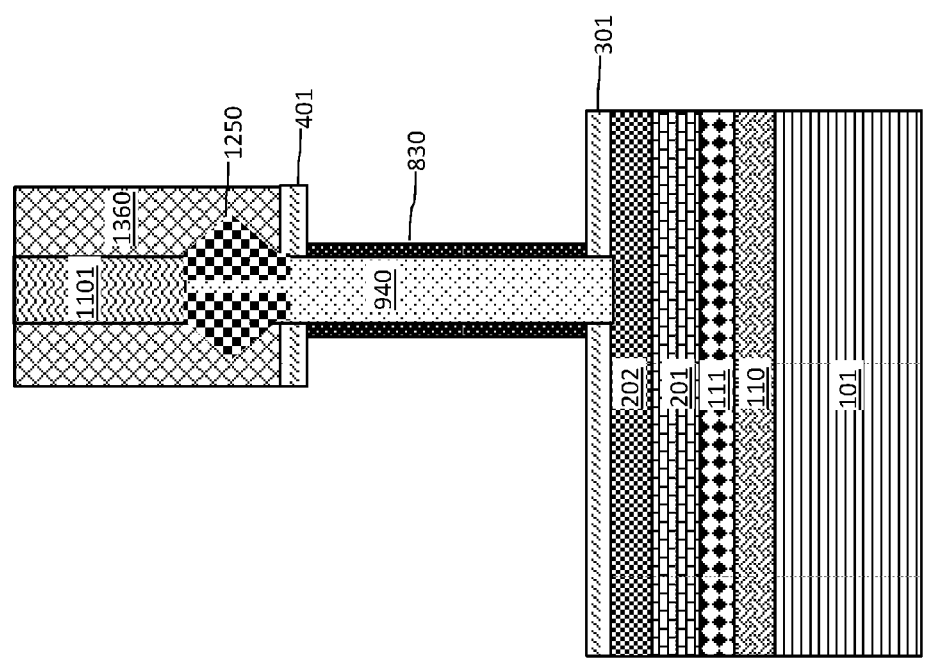

FIGS. 15A and 15B are a cross-sectional side view and a top view, respectively, after removing remaining portions of the sacrificial gate material 420. The layer of oxide 830 is exposed. The sacrificial gate material 420 may be removed by a wet etch process, for example, a process that includes hot ammonia.

Figure 16B:
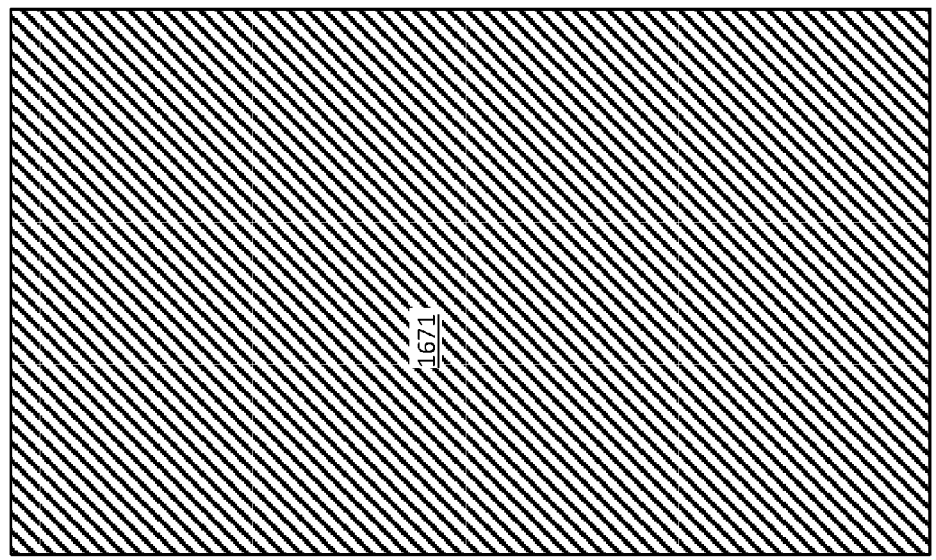
FIGS. 16A and 16B are a cross-sectional side view and a top view, respectively, after depositing a dielectric material layer and a work function metal layer.
Figure 16A:
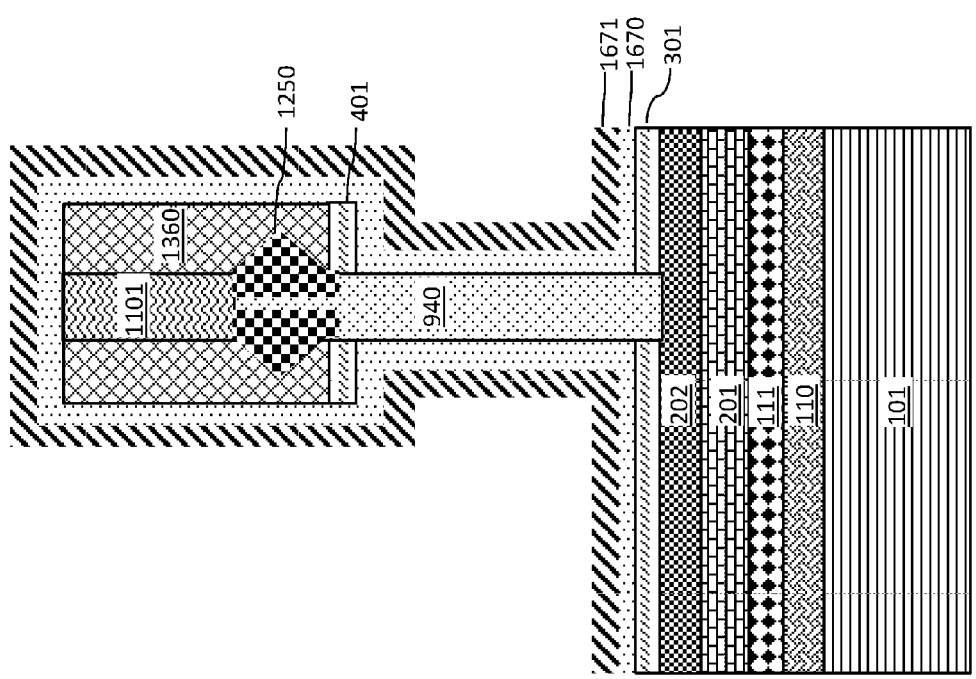

FIGS. 16A and 16B are a cross-sectional side view and a top view, respectively, after depositing a gate dielectric material layer 1670 and a work function metal layer 1671. The oxide 830 is removed from the channel 940 sidewall before depositing the gate dielectric material layer 1670 and the work function metal layer 1671. The gate dielectric material layer 1670 and the work function metal layer 1671 form a portion of the gate stack that replaces the sacrificial gate material 420. The dielectric material layer 1670 and the work function metal layer 1671 are disposed on the dielectric material 1101, spacer 1360, first spacer 301, the channel 940, and remaining portions of the second spacer 401 beneath the source/drain region 1250.

The gate dielectric material(s) can be a dielectric material having a dielectric constant greater than 3.9, 7.0, or 10.0. Non-limiting examples of suitable materials for the gate dielectric material layer 1670 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric material layer 1670 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes.

The work function metal(s) may be disposed over the gate dielectric material layer 1670. The type of work function metal(s) depends on the type of transistor. Non-limiting examples of suitable work function metals for the work function metal layer 1671 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

Figure 17B:
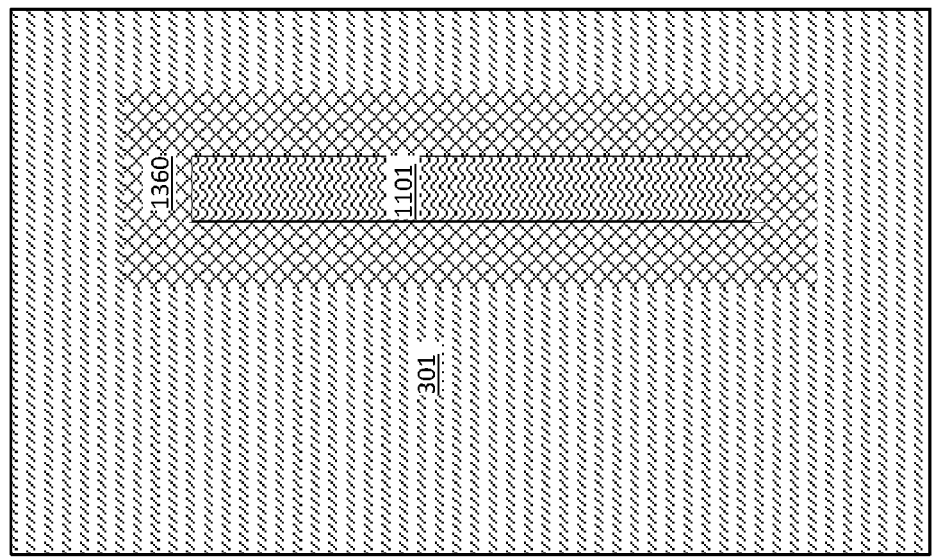
FIGS. 17A and 17B are a cross-sectional side view and a top view, respectively, after removing portions of the dielectric material layer and the work function metal layer.
Figure 17A:
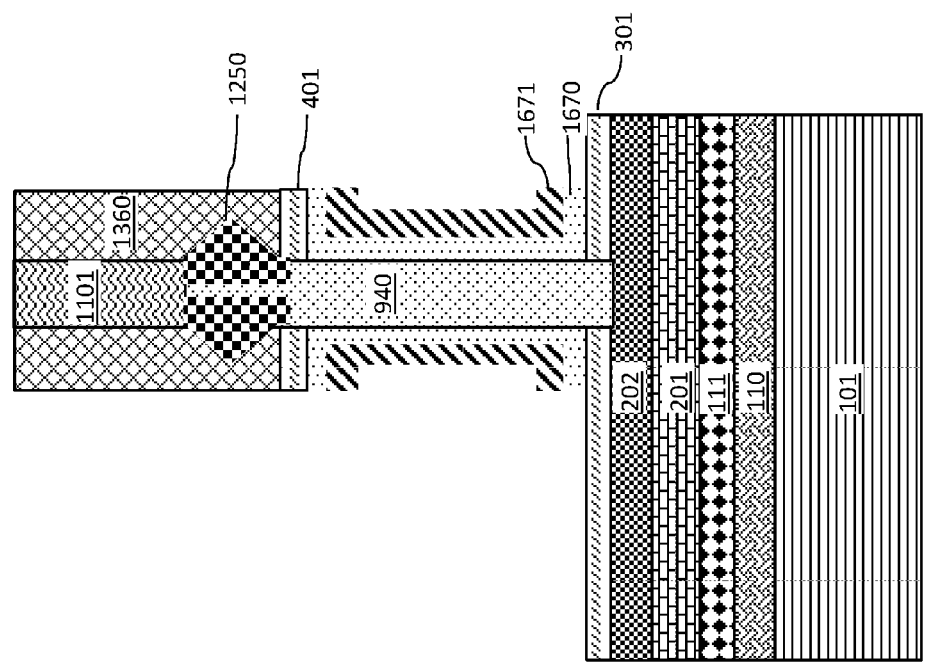

FIGS. 17A and 17B are a cross-sectional side view and a top view, respectively, after removing a portion of the gate dielectric material layer 1670 and the work function metal layer 1671. An anisotropic etch may be performed to remove the gate dielectric material layer 1670 and the work function metal layer 1671 from the surfaces of the spacer 1360, surfaces of the dielectric material 1101, and portions of surfaces of the first spacer 301. The gate dielectric material layer 1670 and the work function metal layer 1671 remain disposed on the channel 940 and in the area between the first spacer 301 and the second spacer 401.

Figure 18A:
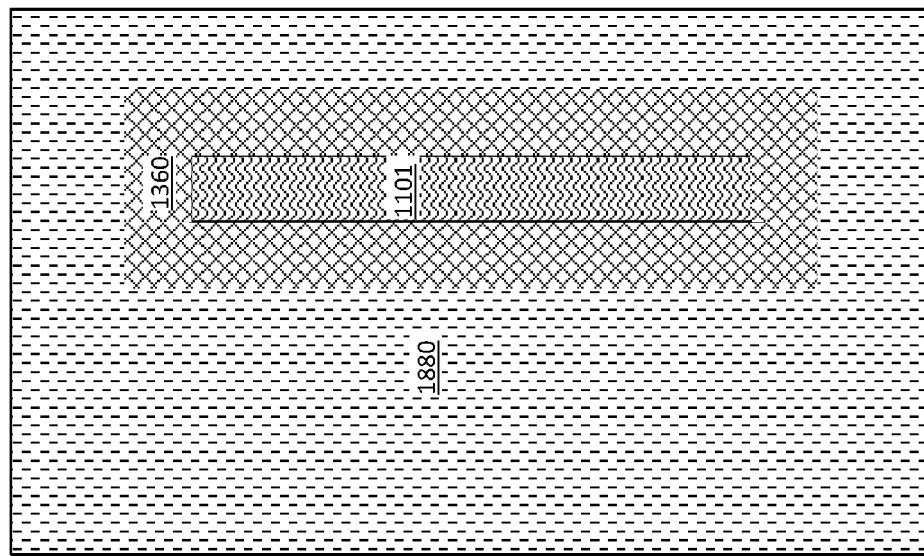
FIGS. 18A and 18B are a cross-sectional side view and a top view, respectively, after depositing a gate metal.
Figure 18B:
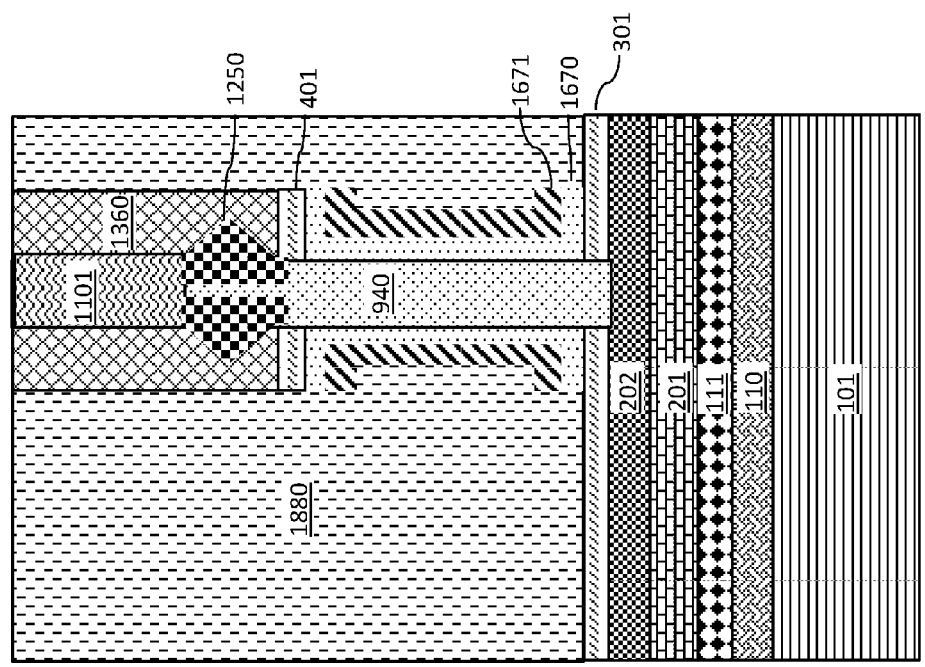

FIGS. 18A and 18B are a cross-sectional side view and a top view, respectively, after depositing a gate metal 1880. The gate metal 1880 is a conductive gate metal that is deposited over the gate dielectric material layer 1670 and the work function metal layer 1671 to form the gate stack around the channel 940. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering. A planarization process, for example, CMP, is performed to polish the surface of the gate metal 1880 after deposition and expose surfaces of the dielectric material 1101 and spacers 1360.

Figure 19B:
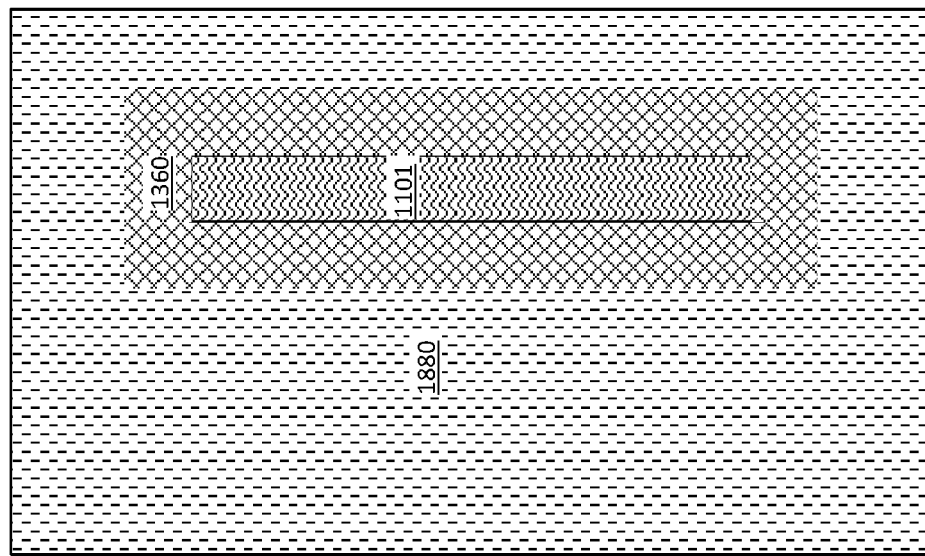
FIGS. 19A and 19B are a cross-sectional side view and a top view, respectively, after partially recessing the gate metal.
Figure 19A:
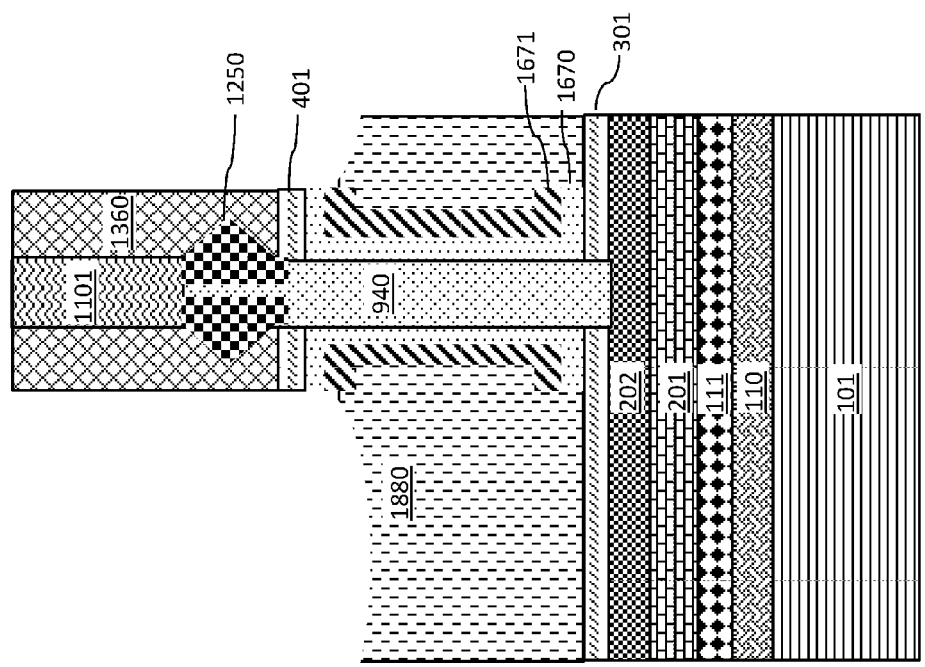

FIGS. 19A and 19B are a cross-sectional side view and a top view, respectively, after partially recessing the gate metal 1880. The gate metal 1880 is partially recessed by an etch process, for example, a RIE process. The gate metal 1880 is recessed to a level that is below the second spacer 401.

Figure 20B:
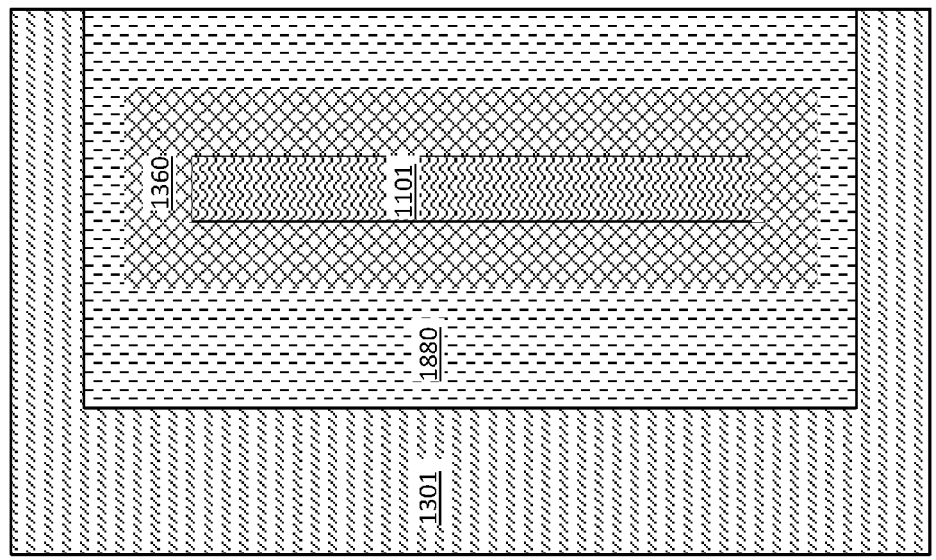
FIGS. 20A and 20B are a cross-sectional side view and a top view, respectively, after removing a portion of the gate metal to expose a portion of the first spacer.
Figure 20A:
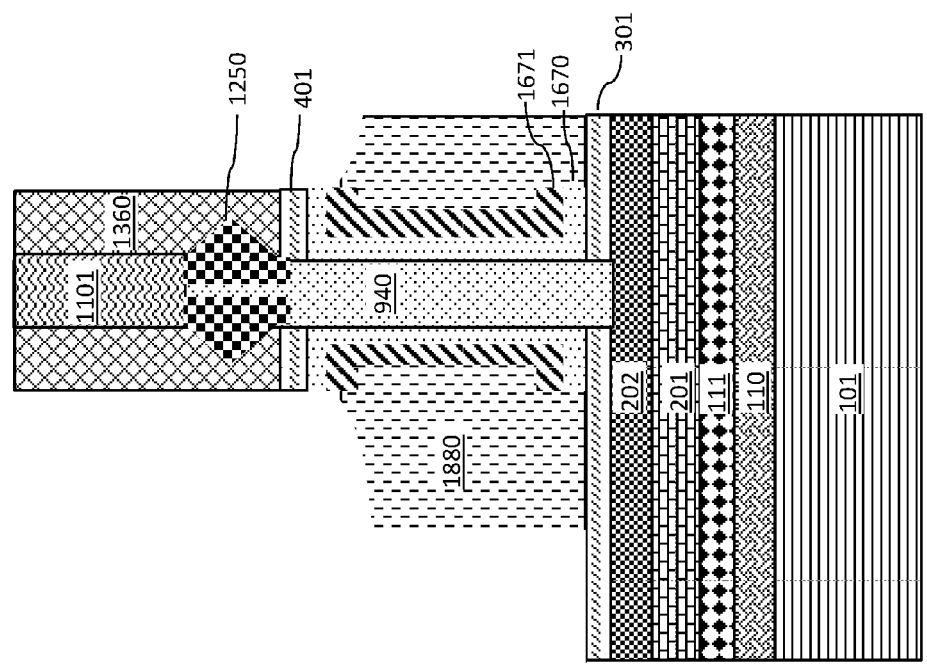

FIGS. 20A and 20B are a cross-sectional side view and a top view, respectively, after removing a portion of the gate metal 1880 to expose a portion of the first spacer 301 and form the final gate stack. Gate lithography and etching processes are performed. A mask (not shown) may be disposed on the gate metal 1880 and subsequently patterned. The pattern is transferred into the gate metal 1880 to remove a portion of the gate metal 1880 and define the gate stack. The gate dielectric material layer 1670 and the work function metal layer 1671 are also etched during these processes. A combination of RIE processes may be used.

Figure 21B:
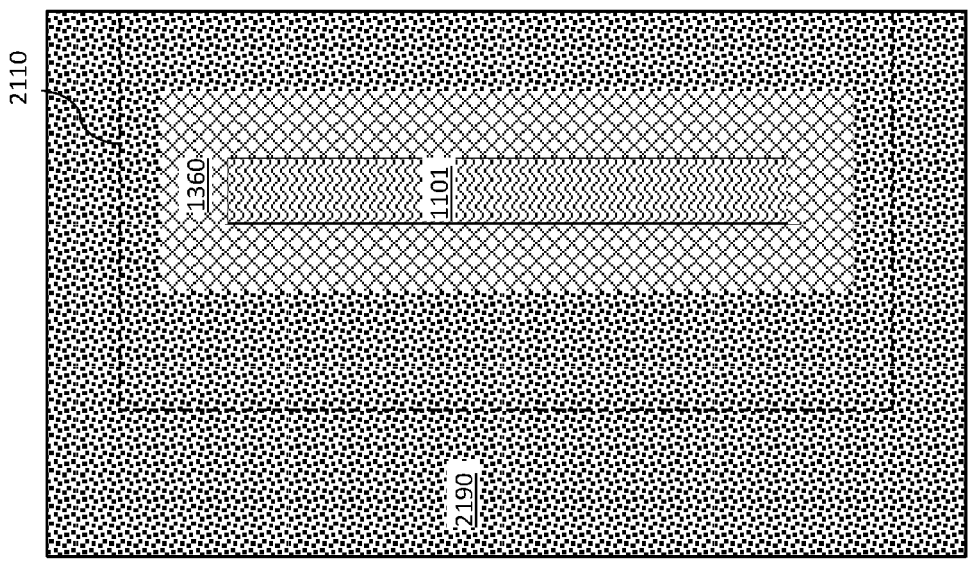
FIGS. 21A and 21B are a cross-sectional side view and a top view, respectively, after depositing an inter-layer dielectric (ILD) on the gate metal.
Figure 21A:
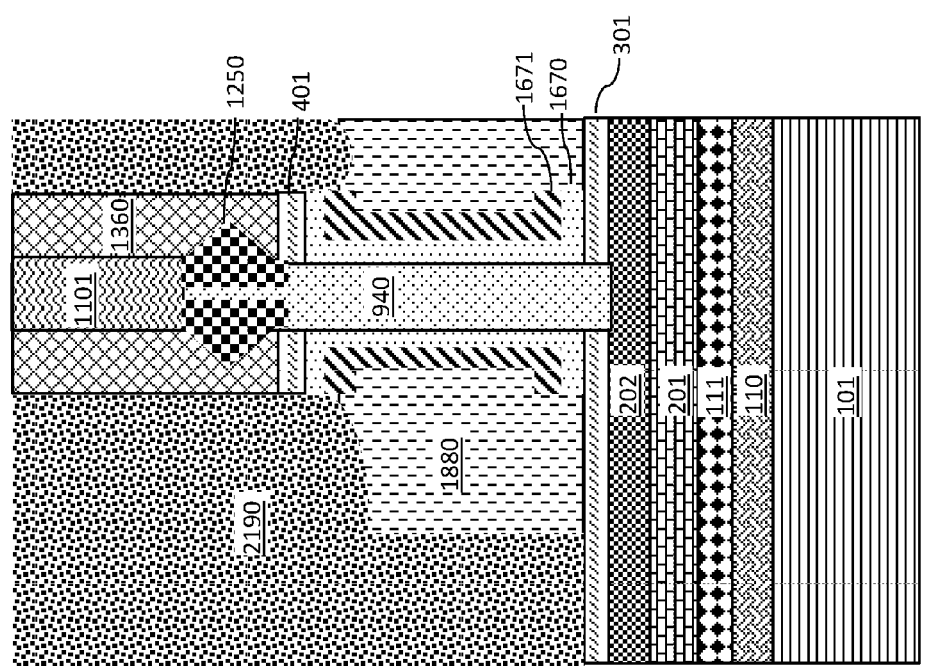

FIGS. 21A and 21B are a cross-sectional side view and a top view, respectively, after depositing an interlayer dielectric (ILD) 2190 on the gate metal 1880. The ILD 2190 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The ILD 2190 is deposited by a deposition process, including, but not limited to CVD, PVD, plasma enhanced CVD (PECVD), atomic layer deposition (ALD), evaporation, chemical solution deposition, or like processes. After deposition, the ILD 2190 is planarized, for example, by CMP, to expose surfaces of the spacers 1360 and the dielectric material 1101. The periphery 2110 of the gate stack is outlined in the top view shown in FIG. 21B.

Figure 22B:
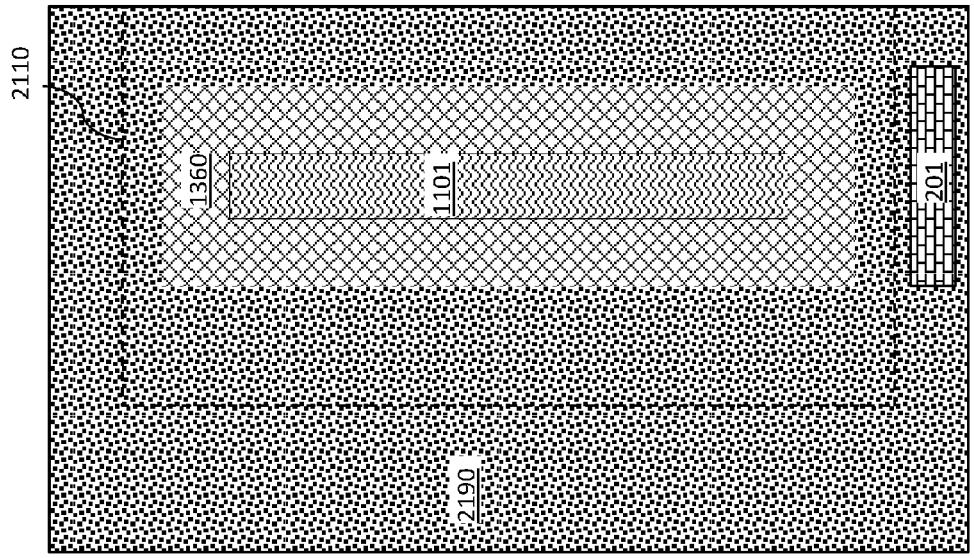
FIGS. 22A and 22B are a cross-sectional side view and a top view, respectively, after forming a source contact trench in the ILD, the first spacer, the second doped semiconductor layer, and the un-doped semiconductor layer.
Figure 22A:
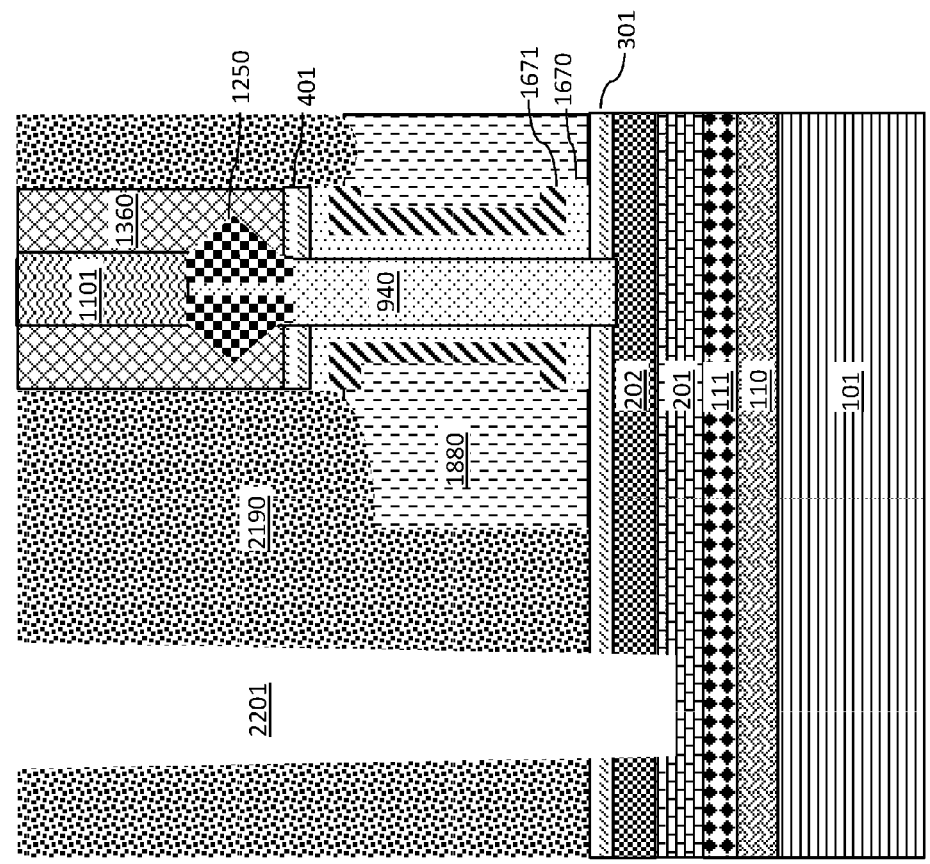

FIGS. 22A and 22B are a cross-sectional side view and a top view, respectively, after forming a source contact trench 2201 through the ILD 2190, the first spacer 301, the second doped semiconductor layer 202, and the un-doped semiconductor layer 201. In other embodiments, the trench may be a drain contact trench. To remove the ILD 2190 and form the source contact trench 2201, a resist, such as a photoresist, may be deposited and patterned. One or more etch processes may be performed, including a RIE, using the patterned resist as an etch mask to remove portions of the ILD 2190, first spacer 301, and second doped semiconductor layer 202 until the un-doped semiconductor layer 201 is exposed.

Figure 23B:
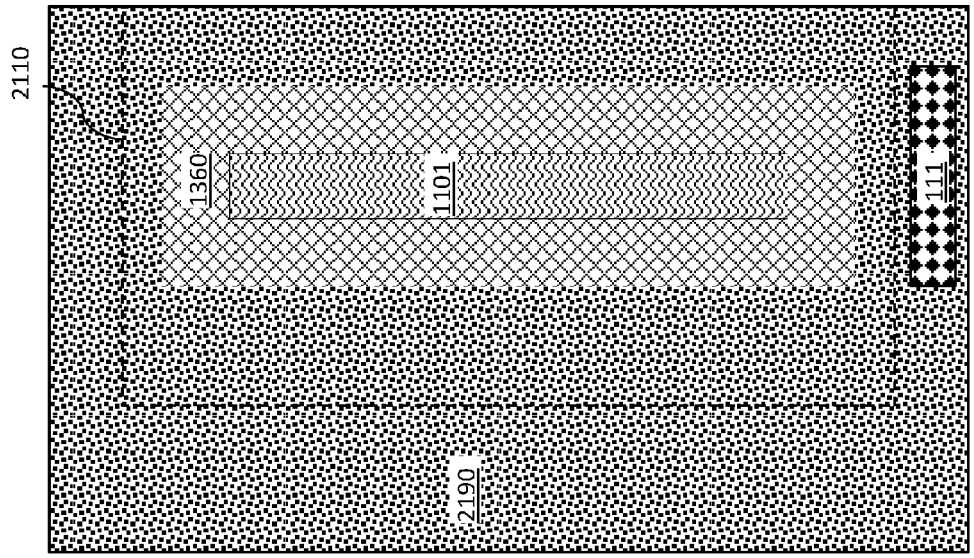
FIGS. 23A and 23B are a cross-sectional side view and a top view, respectively, after removing the un-doped semiconductor layer.
Figure 23A:
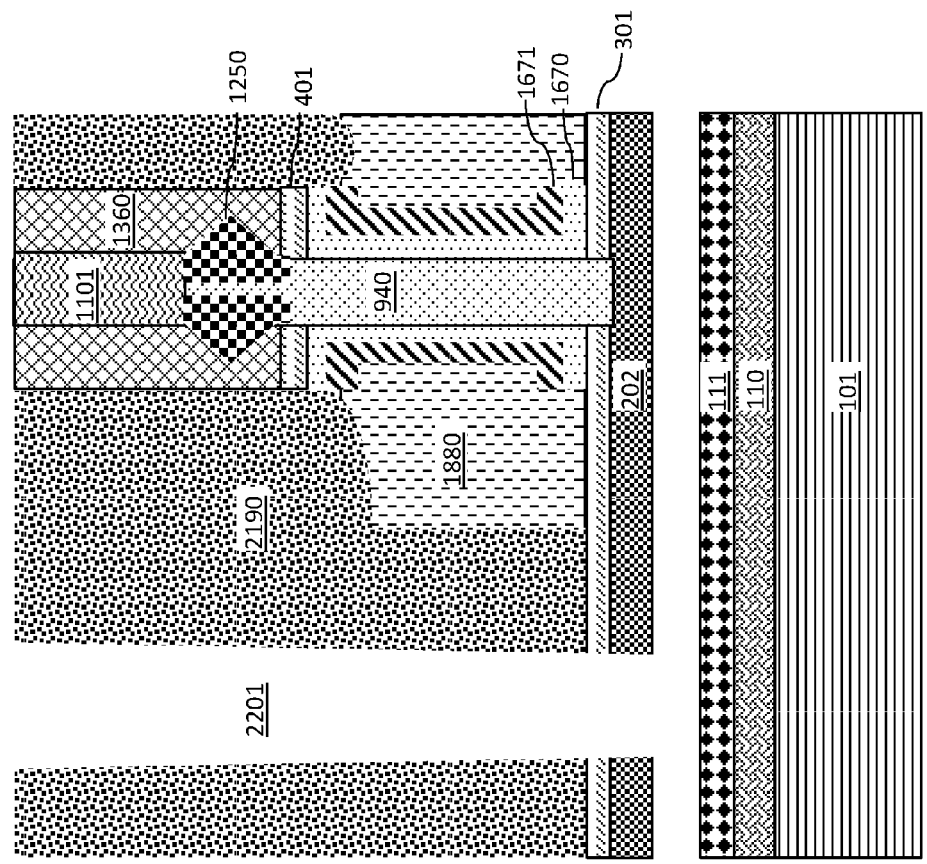

FIGS. 23A and 23B are a cross-sectional side view and a top view, respectively, after removing the un-doped semiconductor layer 201. Performing a selective etch process to remove the un-doped semiconductor layer 201, leaving the first doped semiconductor layer 111 and the second doped semiconductor layer 201 substantially intact, forms a horizontal opening between the first doped semiconductor layer 111 and the second doped semiconductor layer 201. As shown in the top view in FIG. 23B, the first doped semiconductor layer 111 is exposed. The selective etch process may be, for example, a wet etch process such as an ammonia etch process. In another example, the selective etch process may be an etch process performed in an epitaxial reactor with hydrochloric acid gas.

Figure 24B:
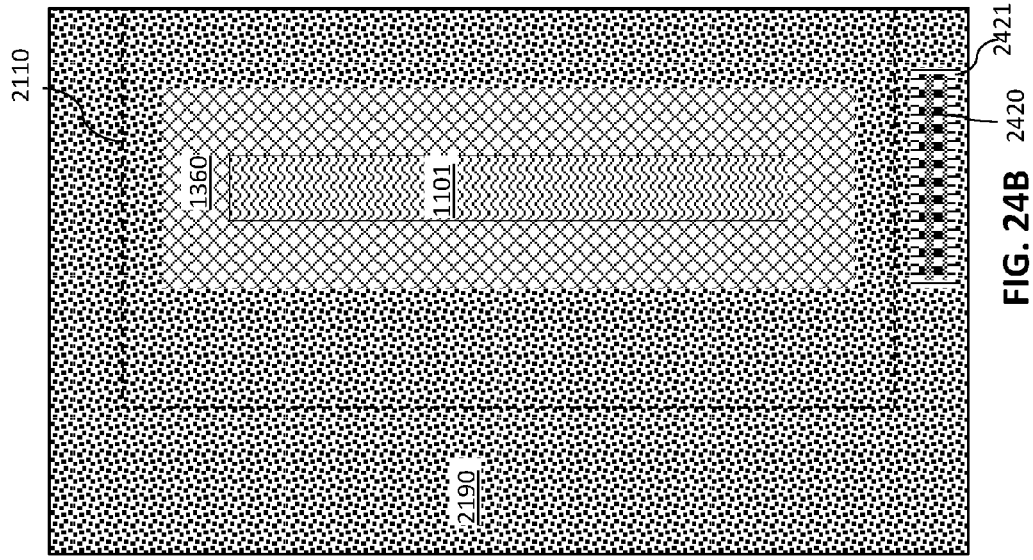
FIGS. 24A and 24B are a cross-sectional side view and a top view, respectively, after depositing a liner and a contact metal in the source contact trench and to replace the un-doped semiconductor layer.
Figure 24A:
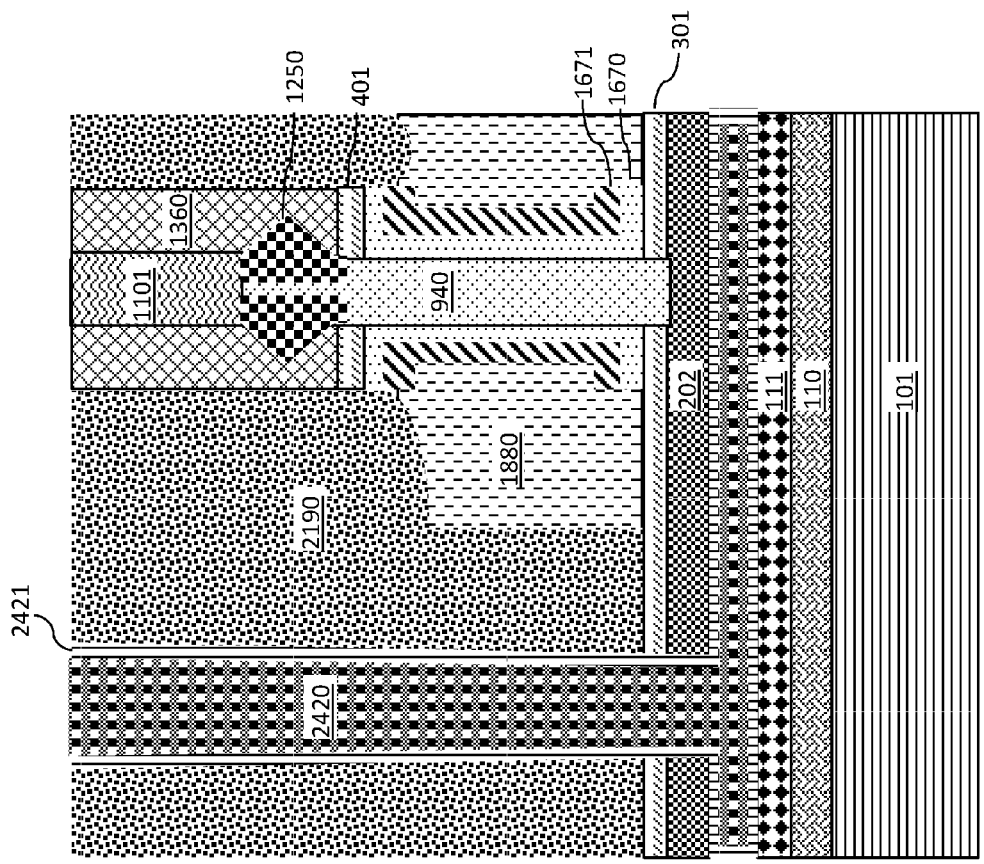

FIGS. 24A and 24B are a cross-sectional side view and a top view, respectively, after depositing a liner 2421 and a contact metal 2420 in the source contact trench 2201 and to replace the un-doped semiconductor layer 201. The liner 2421 and contact metal 2420 fill the opening previously occupied by the un-doped semiconductor layer 201. The liner 2420 may be deposited by, for example, an atomic layer deposition process (ALD). In ALD, for example, the liner 2421 and contact metals are deposited conformally on all exposed surfaces. Even though the horizontal surface below the transistor is embedded underneath the transistor, the fact that there is a trench opening which allows the gas to flow through the horizontal region allows for the liner 2421 and metal deposition to coat this surface.

The liner 2421 arranged on sidewalls of the source contact trench 2201 and the horizontal opening between the first doped semiconductor layer 111 and the second doped semiconductor layer 202 may be a silicide liner that is formed by depositing a metallic film and then performing a thermal treatment to the metallic film. The metallic film can be deposited by performing an evaporation process or a sputtering process. The metallic film is annealed by heating inside a furnace or performing a rapid thermal treatment in an atmosphere containing pure inert gases (e.g., nitrogen or argon) so that the metal reacts with exposed silicon in the first doped semiconductor layer 111 and the second doped semiconductor layer 202 to form a metal silicide layer. Non-limiting examples of suitable metal silicide materials include titanium silicide, tungsten silicide, cobalt silicide, nickel silicide, molybdenum silicide, platinum silicide, or any combination thereof.

After forming the liner 2421, the contact metal 2420 is deposited onto the liner 2420. The liner 2421 is arranged on sidewalls of the layer of metal that is formed between the first doped semiconductor layer 111 and the second doped semiconductor layer 202. The contact metal 2420 may be one or more conductive metals, for example, aluminum (Al), platinum (Pt), gold (Au), tungsten (W), titanium (Ti), or any combination thereof. The contact metal 2420 may be deposited by a suitable deposition process, for example, CVD, PECVD, PVD, plating, thermal or e-beam evaporation, or sputtering. A planarization process, for example, CMP, is performed to remove any residual contact metal and liner 2421 material from the surface of the ILD 2190. The contact metal 2420 forming the vertical source contact and the horizontal layer of metal in the source region are the same.

Filling the region between the first doped semiconductor layer 111 and the second doped semiconductor layer 202 to horizontally extend the source contact through the source region reduces the device resistance at the bottom contact electrode of the vertical transistor. Compared to vertical transistors that use a single doped semiconductor layer to form the source, the metal extending through the source reduces resistance because metal is less resistant than a doped semiconductor layer.

Figure 25B:
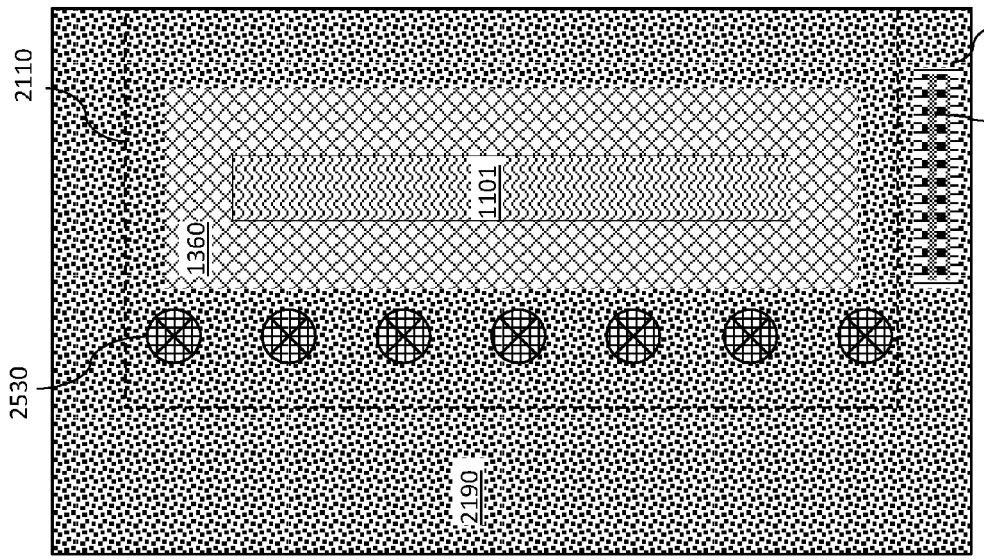
FIGS. 25A and 25B are a cross-sectional side view and a top view, respectively, after forming gate contacts.
Figure 25A:
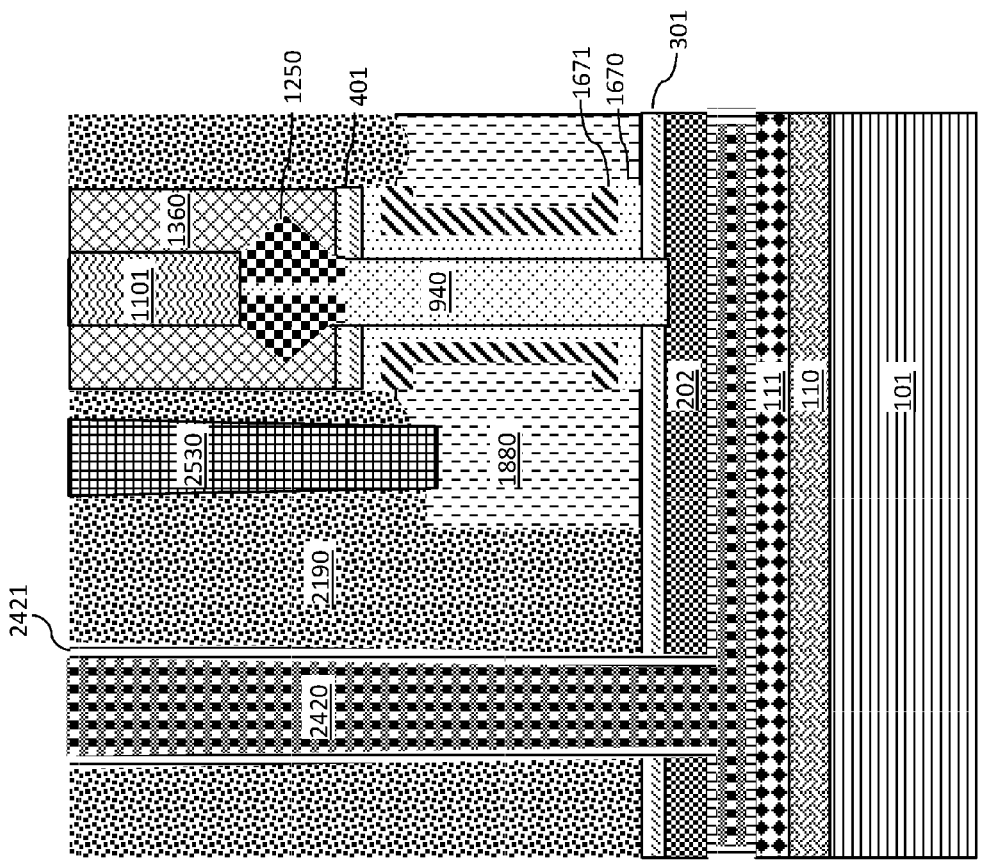

FIGS. 25A and 25B are a cross-sectional side view and a top view, respectively, after forming gate contacts 2530. The gate contacts 2530 extend from the surface of the ILD 2190 to the gate metal 1880. The gate contacts 2530 are formed by patterning a trench in the ILD 2190. To remove the ILD 2190 and form the gate contact trenches, a resist, such as a photoresist, may be deposited and patterned. An etch process, such as a RIE, may be performed using the patterned resist as an etch mask to remove the ILD 2190 until the gate metal 1880 is exposed. The gate contact trenches are filled with a conductive material or a combination of conductive materials. The conductive material may be a conductive metal, for example, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the ILD 2190.

Figure 26B:
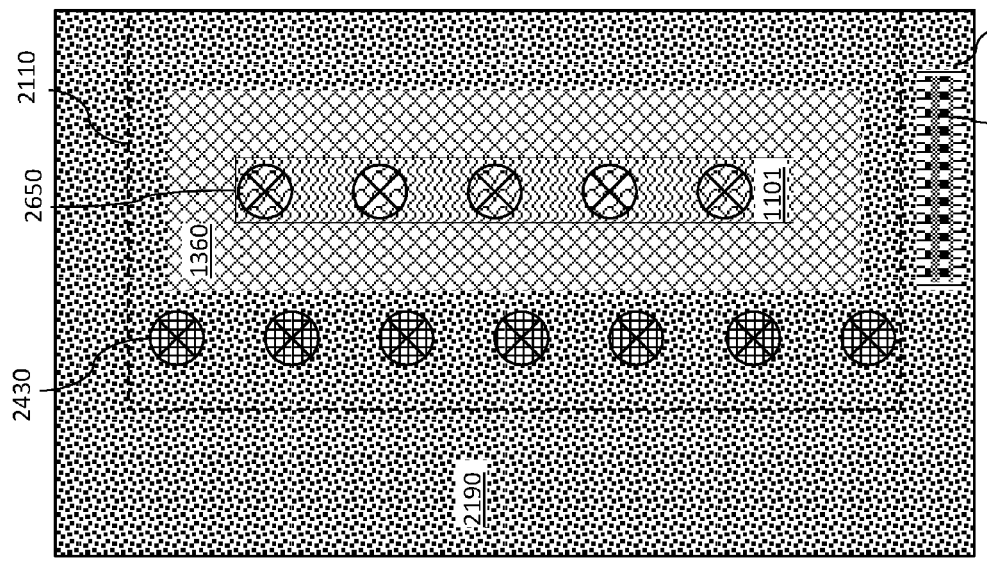
Figure 26A:
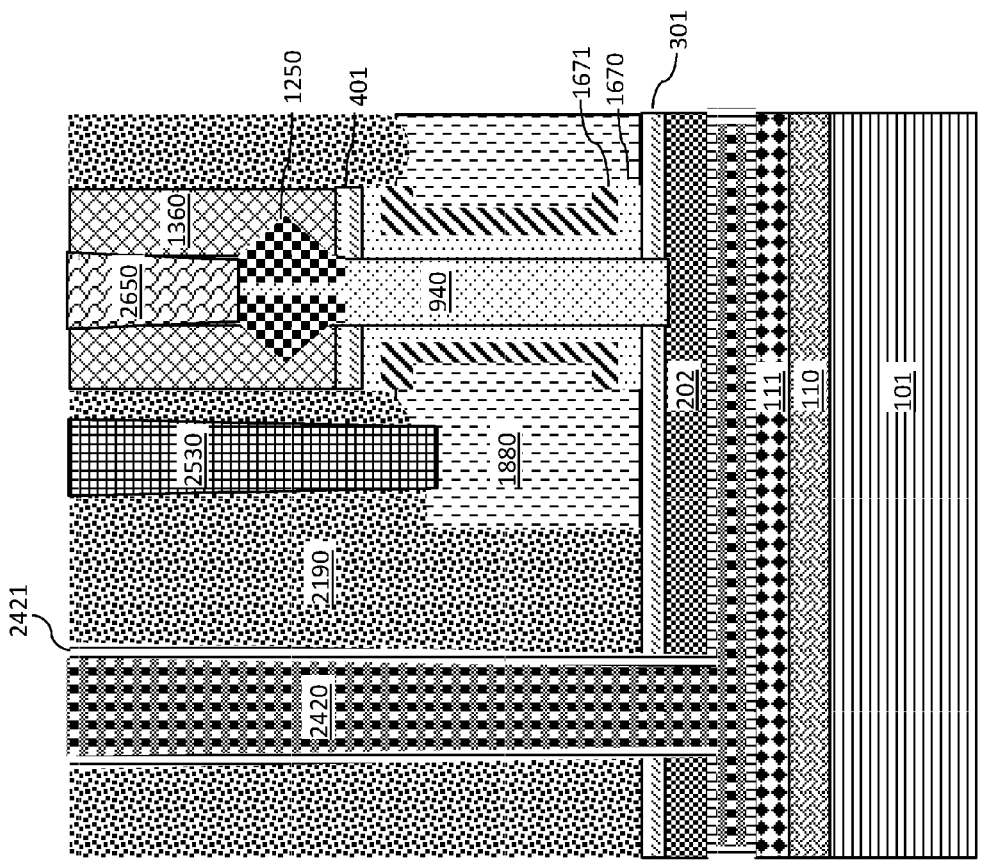

FIGS. 26A and 26B are a cross-sectional side view and a top view, respectively, after forming drain contacts 2650. The drain contacts 2650 extend between the spacers 1360 to the epitaxial growth forming the source/drain region 2550. In other embodiments, the drain contacts 2650 may be source contacts. At least a portion of the dielectric material 1101 is removed over the source/drain region 1250 to form a drain contact trench. The drain contact trenches are filled with a conductive material or a combination of conductive materials, as described above for the gate contacts 2530.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a semiconductor device, the method comprising:
    disposing a first doped semiconductor layer on a substrate;
    disposing an un-doped semiconductor layer on the first doped semiconductor layer;
    disposing a second doped semiconductor layer on the un-doped semiconductor layer;
    disposing an inter-layer dielectric (ILD) on the second doped semiconductor layer;
    removing a portion of the ILD, the second doped semiconductor layer, and the un-doped semiconductor layer to form a trench that extends from a surface of the ILD to the un-doped semiconductor layer;
    removing the un-doped semiconductor layer by a selective etch process such that the first doped semiconductor layer and the second doped semiconductor layer remain substantially intact and to form a horizontal opening between the first doped semiconductor layer and the second doped semiconductor layer; and
    depositing a metal to fill the trench in the ILD and the horizontal opening to form a metal layer between the first doped semiconductor layer and the second doped semiconductor layer, the first doped semiconductor layer, the metal layer, and the second doped semiconductor layer forming a source.

2. The method of claim 1, further comprising forming a silicide liner on a sidewall of the trench and the horizontal opening before depositing the metal.

3. The method of claim 1, wherein the selective etch process is an ammonia etch process, a hydrochloric acid gas process, or a combination thereof.

4. The method of claim 1, wherein the first doped semiconductor layer and the second doped semiconductor layer include a dopant that is the same in both layers.

5. The method of claim 1, further comprising disposing a counter-doped semiconductor layer on the substrate beneath the first doped semiconductor layer, the counter-doped semiconductor layer comprising a dopant that is different than the first doped semiconductor layer.

6. The method of claim 1, wherein the first doped semiconductor layer, the un-doped semiconductor layer, and the second doped semiconductor layer comprise silicon germanium.

7. The method of claim 1, wherein the first doped semiconductor layer and the second doped semiconductor layer comprise a p-type dopant.

8. The method of claim 1, wherein the first doped semiconductor layer, the un-doped semiconductor layer, and the second doped semiconductor layer are epitaxial layers.

9. A method of making a semiconductor device, the method comprising:
    forming four epitaxial layers on a substrate to form a source region, the four epitaxial layers being:
        a counter-doped layer;
        a first doped layer arranged on the counter-doped layer;
        an un-doped layer arranged on the first doped layer; and
        a second doped layer arranged on the un-doped layer, the first doped layer and the second doped layer comprising a p-type dopant, and the counter-doped layer comprising an n-type dopant;
    disposing an inter-layer dielectric (ILD) on the second doped layer;
    removing a portion of the ILD, the second doped layer, and the un-doped layer to form a source contact trench that extends from a surface of the ILD to the un-doped layer;
    removing the un-doped layer to form a horizontal opening between the first doped layer and the second doped layer; and
    depositing a metal in the source contact trench and the horizontal opening to form a source contact that abuts a horizontal layer of metal that extends between the first doped layer and the second doped layer.

10. The method of claim 9, wherein the four epitaxial layers are formed sequentially within a single epitaxial reactor without breaking for air.

11. The method of claim 9, wherein the p-type dopant is boron.

12. The method of claim 9, further comprising forming a silicide liner on a sidewall of the source contact trench and the horizontal opening before depositing the metal.

13. The method of claim 9, wherein removing the undoped layer is a selective etch process that leaves the first doped layer and the second doped layer substantially intact.

14. The method of claim 9, wherein the four epitaxial layers comprise silicon germanium.

\* \* \* \* \*